(12) United States Patent
Sakai et al.

(10) Patent No.: US 6,268,263 B1
(45) Date of Patent: *Jul. 31, 2001

(54) METHOD OF FORMING A TRENCH TYPE ELEMENT ISOLATION IN SEMICONDUCTOR SUBSTRATE

(75) Inventors: Maiko Sakai; Takashi Kuroi; Katsuyuki Horita, all of Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/196,134

(22) Filed: Nov. 20, 1998

(30) Foreign Application Priority Data

Jun. 10, 1998 (JP) ............................................. P10-162313

(51) Int. Cl.[7] ........................ H01L 21/76; H01L 21/302; H01L 21/461

(52) U.S. Cl. .......................................... 438/424; 692/970

(58) Field of Search ................................... 438/424, 691, 438/427, 692, 970

(56) References Cited

U.S. PATENT DOCUMENTS

| | | | |
|---|---|---|---|
| 5,498,565 | * 3/1996 | Gocho et al. | 437/67 |
| 5,923,993 | * 7/1999 | Sahota | 438/427 |
| 5,926,722 | * 7/1999 | Jang et al. | 438/424 |
| 5,972,773 | * 10/1999 | Liu et al. | 438/424 |
| 6,027,554 | * 2/2000 | Kodama et al. | 106/3 |

* cited by examiner

Primary Examiner—Vu A. Le
Assistant Examiner—Adam Pyonin
(74) Attorney, Agent, or Firm—Oblon, Spivak, McClelland, Maier & Neustadt, P.C.

(57) ABSTRACT

A trench (21) is formed in a silicon substrate (1) on which an underlying oxide film (2) and a silicon nitride film (3) are formed. Then, a silicon oxide (11) is deposited by an HDP-CVD method to fill the trench (21) with the oxide. Further, a resist (41) including a second resist portion (42), and a resist (43) are formed. The silicon oxide film (11) that is not covered with the resists (41) and (43), is removed by dry etching. Etch selectivity of the silicon oxide film (11) to the stopper film (3) is not less than a value $(2(c-a)/d)$ obtained by dividing twice a value $(c-a)$ which is obtained by subtracting an alignment margin (a) from the maximum film thickness (c) of the silicon oxide film (11), by the film thickness (d) of the stopper film (3). The resists (41) and (43) are then removed, and the residual silicon oxide film (11B, 11DC, 11DE, 11FE) is polished and removed by the CMP method. This forms a trench type element isolation with no depression at its edge portion.

13 Claims, 20 Drawing Sheets

<PRIOR ART>

<PRIOR ART>

METHOD OF FORMING A TRENCH TYPE ELEMENT ISOLATION IN SEMICONDUCTOR SUBSTRATE

BACKGROUND OF THE INVENTION

1. Field of the Invention

The present invention is related to a method of manufacturing a semiconductor device, and the device. More specifically, the present invention relates to a technique for planarizing a film on a semiconductor substrate having a trench type element isolation structure.

2. Background of the Invention

A semiconductor integrated circuit needs to avoid electrical interference between elements to control them independently in operation. For this reason, the semiconductor integrated circuit has adopted the element isolation structure having an element isolation region. One of well-known methods for forming such a structure is a trench isolation method, to which various improvements have been proposed.

The trench isolation method is a method for providing electrical isolation between elements by forming a trench in a substrate from the surface and filling the trench with a dielectric. This method causes little bird's beak that is found in a structure formed by a LOCOS method, thereby reducing the area of the element isolation structure on the substrate surface as compared with the LOCOS method. Thus, the trench isolation method is suitable for promoting downsizing of a semiconductor integrated circuit. That is, it can be said that the method is an indispensable element isolation method for a semiconductor device which will be more downsized.

In a manufacturing process of a downsized, multi-layer integrated circuit, with a reduction in focus margin in the photolithography process or a reduction in overetching in the etching process, it becomes important to ensure flatness of each layer formed on the substrate. For this reason, a CMP method has been widely performed to planarize the top surface of the substrate after the trench type element isolation structure is formed.

Before planarization by the CMP method, for the purpose of reducing polishing time and avoiding over-polishing (dishing) in a large element isolation region, dry etching is often applied to a large protrusion on the surface previous to the polishing by the CMP method. Such preliminary planarization is hereinafter referred to as "first planarization", while the planarization by the CMP method as "second planarization". A planarization technique which combines the first and the second planarization, can be said a simple and effective technique for high-precision planarization.

To achieve element isolation by the trench isolation method, it is necessary to fill a narrow-opened trench with a dielectric without "key-hole" shaped cross-sectional void (seam). One of outstanding methods to meet this requirement is a film formation method, such as an HDP-CVD (High Density Plasma-Chemical Vapor Deposition), that performs etching and deposition at the same time. In the following description, we take the HDP-CVD method as an example.

A film formed by the HDP-CVD method has a characteristic section shape as described later. Thus, it is impossible to employ first planarization according to a conventional technique, as it is, that is given for planarizing a film formed by a film formation method such as a low-pressure CVD method (disclosed, for example, in Japanese Patent Laid-Open No. 9-102539). To resolve this problem, various propositions have been made. We will now described such propositions, referring to the drawings.

FIGS. 21 to 28 are longitudinal cross-sectional views of a semiconductor device, showing successive stages of a method for manufacturing the device according to a first conventional technique.

As shown in FIG. 21, a silicon substrate 101, on which (on a surface 101S) a silicon oxide film (or underlying oxide film) 102 and a silicon nitride film 103 are sequentially formed, is etched to form trenches 121A and 121C (each referred to also as a trench 121) that form element isolation regions 120A and 120C (each referred to also as an element isolation region 120), respectively. More specifically, with a photolithography pattern used as a mask, the silicon nitride film 103 and the silicon oxide film 102 are anisotropically etched to form the trenches 121 in the silicon substrate 101 from the surface 101S to a predetermined depth. In the drawing, regions except the element isolation regions 120 are active regions 130B and 130D (each referred to also as an active region 130). The concept of the element isolation regions 120 and the active regions 130 includes not only a two-dimensional region on the surface 101S of the silicon substrate 101 but also a three-dimensional region in a direction perpendicular to the surface 101S of the silicon substrate 101.

In the following drawings, when there is a necessity to distinguish between each of the element isolation regions 120 or between each of the active regions 130, an additional English alphabet is attached to the reference numeral of each region, for example, the element isolation regions 120A, 120C or the active regions 130B, 130D as shown in FIG. 21. Similarly, the same component in each element isolation region 120 or in each active region 130 is distinguished by attaching the alphabet of each region to the reference numeral thereof.

Next, as shown in FIG. 22, silicon oxides 111 are formed on the overall surface by the HDP-CVD method, by which the trenches 121A and 121C are filled with silicon oxides 111A and 111C, respectively. Each of the silicon oxides 11A and 111C buried in the trenches 121A and 121C is referred to also as a "buried oxide 111", while each of silicon oxides 111B and 111D formed on the silicon nitride films 103B and 103D, respectively, is referred to also as a "silicon oxide film 111". The silicon oxide films 111B and 111D have characteristic shapes due to the properties of film formation by the HDP-CVD method. That is, the silicon oxide films 111 are formed to be protrusions having triangular or trapezoidal section shapes, depending on the width of the active regions 130. The slope of such protrusions from the edges of the active regions 130 has a gradient of about 45° to the substrate surface 101S. Thus, a trapezoidal silicon oxide film 111D is formed on the silicon nitride film 103D in the active region 130D which has a width of twice the thickness of the silicon oxide film 111D.

Next, a resist is formed on the overall surface of the silicon oxides 111. The resist is then patterned by photolithography to form a resist 141 having a pattern shown in FIG. 23. More specifically, as shown in FIG. 23, the resist 141 is formed to cover the silicon oxides (buried oxides) 111 in all the element isolation regions 120, and the silicon oxide films 111 in the active regions 130 that range from each edge of the element isolation regions 120 to a distance equivalent to the maximum film thickness of the silicon oxide films 111 (or film thickness of the buried oxides 111). Further, if the opening width of the resist 141 in the active region 130 is smaller than the minimum design size of the semiconductor device (e.g., the active region 130B in FIG. 23), the resist 141 is further formed on the silicon oxide film 111 in that active region.

Then, the silicon oxide film 111 that is not covered with the resist 141 is dry etched, with the silicon nitride film 103 used as a stopper film. That is, the silicon oxide film 111D of the maximum film thickness h on the silicon nitride film 103D is etched back. This completes the first planarization of the silicon oxide film 111 (see FIG. 24).

After that, the resist 141 is removed to expose the silicon oxide films 111 covered with the resist (see FIG. 25).

Next, the exposed silicon oxide films 111 (including the remainder of the silicon oxide film 111D), shown in FIG. 25, are polished and removed by the CMP method (second planarization). In planarization by the CMP method, a stopper film is generally provided at the end of polishing. When a silicon oxide film is a film to be polished, a silicon nitride film having sufficiently lower polishing rate than that of the silicon oxide film is, in most cases, used as a stopper film. That is, the silicon nitride film 103 acts as a stopper film in the second planarization. After this planarization, there remain only the silicon oxides (buried oxides) 111 in the trenches 121 as shown in FIG. 26.

Then, the silicon nitride films 103 are removed by thermal phosphoric acid.

Next, a silicon oxide film is formed on the surfaces of the underlying oxide films 102 and the buried oxides 111. The silicon oxide film is then anisotropically etched to form sidewalls 131BA, 131BC, and 131DC (each referred to also as a sidewall 131), as shown in FIG. 27, at the side walls of the buried oxides 111 that protrude above the surface of the underlying oxide films 102. The sidewalls 131 protect the edge portions of the buried oxides 111 in the trenches 121 during hydrofluoric-acid treatment which will be described later.

The silicon oxide films 102 and the sidewalls 131 are then removed by wet etching using hydrofluoric acid. This forms, as shown in FIG. 28, trench or wedge type element isolations 111 comprising the silicon oxides (buried oxides) 111 buried in the trenches 121.

The aforementioned first conventional technique has several problems as follows:

(1) First, since the maximum film thickness of the silicon oxide film 111 that remains on the silicon nitride film 103 after the first planarization, is equivalent to the height h of the buried oxides 111 or the depth h of the trenches 121, the total amount of the residual silicon oxide films 111 is extremely high. This increases the amount to be polished by the CMP method, thereby considerably increasing the polishing time.

(2) Especially when it takes a considerable time to polish a relatively large element isolation region 111A (FIG. 25) by the CMP method, a further problem will arise. For example, when the polishing by the CMP method is performed by the amount that depends on the residual silicon oxide film 111D of the maximum film thickness on the silicon nitride film 103D (c.f., FIG. 25), in regions except the active region 130D, not only the silicon oxide films 111 but also the silicon nitride films 103 which are to act as stopper films will be polished as shown in FIG. 26. This is more likely to occur in the silicon nitride film 103 adjacent to a relatively large element isolation region 120 than in the silicon nitride film 103 in a region clustered with the active regions 130. In this case, as shown in FIG. 27, the height of the side walls of the buried oxide 111 that protrude above the surface of the underlying oxide film 102 is reduced, so that only a low sidewall such as the sidewall 131BA is formed thereat. Since the low sidewall 131BA fails to adequately protect the edge portion of the buried oxide 111A during the hydrofluoric-acid treatment at the ninth process, a depression 132AB is generated, as shown in FIG. 28, at the edge portion of the buried oxide 111A.

(3) When an element that constitutes a semiconductor device, such as an MOSFET, is formed in the active region 130B adjacent to the depression 132AB, gate electric field will be easily concentrated at the edge portion of the active region 130B. This causes imperfections in the device characteristics: inverse narrow channel effect or hump in sub-threshold characteristics of the MOSFET. The inverse narrow channel effect is described in detail in IEEE ELECTRON DEVICE LETTERS, VOL EDL-7, NO. Jul. 7, 1986, pp. 419–421.

With respect to the sub-threshold characteristics, a normal MOSFET has drain-current (Id) characteristics (sub-threshold characteristics) to a gate voltage Vd as shown in FIG. 29. When an element isolation 111 includes the depression 132AB, however, gate electric field is concentrated at the edge portion of the active region 130B which is adjacent to the depression 132AB. This causes hump in the sub-threshold characteristics of the MOSFET as shown in FIG. 30. That is, the hump occurs because the threshold voltage of a parasitic MOSFET which is formed due to the depression 132AB of the buried oxide (element isolation) 111, is smaller than that of a real MOSFET.

Next, referring to FIGS. 31 to 33, we will describe a method of manufacturing a semiconductor device according to a second conventional technique that can prevent the generation of the aforementioned depression 132AB. FIGS. 31 to 33 are longitudinal cross-sectional views of the semiconductor device, showing successive stages of the method.

First, as in the method of the first conventional technique, trenches 221 (221A, 221C, and 221E) forming element isolation regions 220 (220A, 220C, and 220E) are formed, as shown in FIG. 31, in a silicon substrate 201 on which (on the surface 201S) an underlying oxide film 202 and a silicon nitride film 203 are formed.

Then, as shown in FIG. 32, silicon oxides 211 are formed inside the trenches 221 and on the silicon nitride film 203 by the HDP-CVD method as in the method of the first conventional technique.

Further, as shown in FIG. 33, a resist 241 is formed in a predetermined region on the surface of the silicon oxides 211 as in the method of the first conventional technique. In this manufacturing method, however, the resist 241 that extends from each edge of the element isolation regions 220 toward the adjacent active regions 230 (corresponding to a second resist portion 242 in FIG. 33) is formed within a range of a distance equivalent to an alignment margin a.

Next, as shown in FIG. 33, the silicon oxide film 211 that is not covered with the resist 241 is dry etched, with the silicon nitride film 203 used as a stopper film. That is, the silicon oxide film 211 of the maximum film thickness h on the silicon nitride film 203 (cf. FIG. 32) is etched back. This completes the first planarization of the silicon oxide film 211.

After that, as in the method of the first conventional technique, the resist 241 is removed to perform the second planarization by the CMP method. Then, the silicon nitride films 203 is removed, and after sidewalls are formed, the silicon oxide films 202 and the sidewalls are etched to be removed. This form trench or wedge type element isolations 211 inside the trenches 221 (see FIG. 28).

We will now summarize the aforementioned problems (1) to (3) of the first conventional technique.

First, since there exists a large amount of the silicon oxide film 111 to be polished as shown in FIG. 23, the second planarization requires a long processing time. Second, since the surface shape after polishing by the CMP method depends on the asperity of the surface before polishing, the depression 132AB will be generated at the edge portion of the large element isolation region 120A as shown in FIG. 28. Third, because of the depression 132AB, gate electric field is easily concentrated at the edge portion of the MOSFET that is formed in the active region 130B adjacent to the large element isolation region 120A. This causes inverse narrow channel effect or hump in the sub-threshold characteristics (cf. FIG. 30), thereby causing imperfections in the device characteristics.

These problems (1) to (3) can be solved by the second conventional technique to some extent. That is, according to the second conventional technique, the range of the resist 241 (cf. FIG. 33) is smaller than that of the resist 141 formed according to the first conventional technique (cf. FIG. 24), so that more silicon oxide film 211 can be removed in the first planarization than in the first conventional technique. This shortens the processing time of polishing by the CMP method (second planarization), resolving the problem (1). Accordingly, the problem (2) (generation of the depression 132AB (cf. FIG. 28)) and the problem (3) due to the depression 132AB can be suppressed.

According to the second conventional technique, however, if etch selectivity is inappropriately set between the silicon oxide film 211 and the silicon nitride film 203 in the first planarization, not only the silicon oxide film 202 and the silicon nitride film 203 that acts as a stopper film in dry etching, but also part of the silicon substrate 201 will be etched as shown in FIG. 33 (problem (4)). Such excessively etched portions 251D and 251F (hereinafter referred to as overetching 251D and 251F) can be often found in a region where the silicon oxide film 211 has a film thickness of less than the maximum film thickness h, and especially in the vicinity of the second resist portions 242.

To avoid such overetching 251D and 251F, it is considered to increase the thickness of the silicon nitride films 203. This, however, increases an aspect ratio of the trenches 221, thereby easily causing defects such as seam (cf. FIG. 34) when the silicon oxides 211 are buried in the trenches 221. We will describe this problem in detail, referring to FIGS. 34 and 35. FIG. 34 is a sectional view of the semiconductor device, and FIG. 35 is a top view thereof. FIG. 34 corresponds to a section taken along a line I—I in FIG. 35. As shown in FIG. 34, each buried oxide 311 has a seam 380, which will be filled with a conductive material in the subsequent process. If the conductive material remains in the seam 380, a plurality of wires 381 formed above the silicon substrate 301 will short via that conductive material as shown in FIG. 35. Because of this, although the overetching 251D and 251F may be prevented to some extent, it has to be admitted that this technique is not appropriate for the method of manufacturing the trench type element isolation.

SUMMARY OF THE INVENTION

A first aspect of the present invention is directed to a method of manufacturing a semiconductor device. The method comprises the steps of: (a) forming a stopper film over the surface of a semiconductor substrate; (b) forming a trench forming an element isolation region, and an active region which consists essentially of regions except the element isolation region by etching the stopper film and part of the semiconductor substrate in a predetermined region from the surface of the stopper film toward the inside of the semiconductor substrate; (c) forming a dielectric on the surface of the stopper film and inside the trench by a film formation method that performs etching and deposition at the same time, to fill the trench with the dielectric to a level of the surface of the stopper film; (d) forming a resist on the dielectric in the element isolation region, and on the dielectric in the active region that ranges from each edge of the element isolation region to a predetermined distance not less than an alignment margin; (e) etching and removing the dielectric in the active region that is not covered with the resist, with the resist used as a mask, by predetermined etch selectivity of the dielectric to the stopper film; (f) removing the resist to expose the dielectric covered with the resist; (g) removing the exposed dielectric in the active region; and (h) removing the stopper film. The etch selectivity is set so that the residual stopper film after the step (e) has a film thickness sufficient to fulfill its function at the step (g).

According to a second aspect of the present invention, in the method of the first aspect, the step (d) comprises a step of further forming a resist on the surface of the dielectric in the active region, when the size of the active region is not more than the total value of a value equivalent to twice the predetermined distance and a value equivalent to the minimum design size of the semiconductor device.

According to a third aspect of the present invention, in the method of the first aspect, the stopper film is resistant to dry etching of the dielectric. Further, the step (e) comprises a step of dry etching the dielectric in the active region that is not covered with the resist, to be removed.

According to a fourth aspect of the present invention, in the method of the third aspect, the predetermined etch selectivity is not less than a value obtained by dividing twice a value which is obtained by subtracting a value equivalent to the predetermined distance from a value equivalent to a distance from the bottom of the trench to the surface of the stopper film, by a value equivalent to the film thickness of the stopper film. Further, the step (g) comprises a step of removing the dielectric by polishing.

According to a fifth aspect of the present invention, in the method of the fourth aspect, the predetermined distance is equivalent to the alignment margin.

According to a sixth aspect of the present invention, in the method of the fourth aspect, the predetermined distance is equivalent to one half of the minimum size, when the minimum size of the active region is not less than the alignment margin.

According to a seventh aspect of the present invention, in the method of the third aspect, the stopper film is resistant to both dry etching and wet etching of the dielectric. Further, the step (e) comprises a step of partially etching the dielectric in the active region that is not covered with the resist by dry etching, and removing the residual dielectric in the active region by wet etching.

According to an eighth aspect of the present invention, in the method of the seventh aspect, the predetermined distance is equivalent to a predetermined amount of the wet etching, and the predetermined etch selectivity is not less than a value obtained by dividing twice a value which is obtained by subtracting a value equivalent to twice the predetermined distance from a value equivalent to the distance from the bottom of the trench to the surface of the stopper film, by a value equivalent to the film thickness of the stopper film. Further, the step (g) comprises a step of removing the dielectric by polishing.

A ninth aspect of the present invention is directed to a semiconductor device formed in accordance with the method of the first aspect.

In the method of the first aspect, since the predetermined etch selectivity is appropriately set, even if the stopper film is etched at the step (e), the residual stopper film can sufficiently fulfill its function at the step (g). Thus, there occurs no overetching of the silicon substrate as is found in the second conventional technique.

Besides, at the step (d), the resist is formed on the dielectric in the element isolation region, and on the dielectric in the active region that ranges from the edge of the element isolation region to the predetermined distance. Thus, the residual dielectric in the active region after the step (e) is smaller in amount than that in the first conventional technique. This reduces the time required for the step (g), as compared with the first conventional technique, thereby preventing the generation of depression at the edge portion of the dielectric in the trench, after the step (g).

Further, since the predetermined distance is not less than the alignment margin, the dielectric buried in the trench can be always covered with the resist even with misalignment. Thus, the dielectric in the trench is not etched at the step (e).

In the method of the second aspect, when the size of an active region is not more than the total value of a value equivalent to twice the predetermined distance and a value equivalent to the minimum design size of the semiconductor device, a resist is further formed on the surface of the dielectric in that active region, at the step (d). Thus, there is no possibility that a pattern not more than the minimum design size will be formed in the manufacturing process. This brings about, in addition to the effect of the first aspect, the effect of avoiding the necessity of relaxing the design rule in the manufacturing process.

The method of the third aspect can achieve a similar effect to that of the first aspect.

Especially, according to the method of the third aspect, the stopper film is resistant to dry etching of the dielectric. Thus, even in dry etching at the step (e), there occurs no overetching, in which even the silicon substrate is etched, as is found in the second conventional technique.

In the method of the fourth aspect, the predetermined etch selectivity is set not less than a value obtained by dividing twice a value which is obtained by subtracting a value equivalent to the predetermined distance from a value equivalent to the distance from the bottom of the trench from the surface of the stopper film, by a value equivalent to the film thickness of the stopper film. Thus, not less than one half of the dielectric can be left after the step (e). This brings about, in addition to the effect of the third aspect, the effect that the stopper film can sufficiently fulfill its function at the step (g) in which the dielectric is removed by polishing.

The method of the fifth aspect can achieve a similar effect to that of the fourth aspect.

The method of the sixth aspect can also achieve a similar effect to that of the fourth aspect.

Especially, since the predetermined distance is equivalent to one half of the minimum size of the active region, all the dielectric that remain after the step (e) are almost of an uniform height. This considerably increases flatness of the top portion of the dielectric in the trench and uniformity in height, after the step (g).

The method of the seventh aspect can achieve a similar effect to that of the third aspect.

Further, according to the method of the seventh aspect, the stopper film is resistant to both dry etching and wet etching of the dielectric. At the step (e), first, the dielectric in the active region that is not covered with the resist is partially etched by dry etching, and then the residual dielectric that is located under the resist is removed by wet etching. Since the dielectric in the active region is removed by such two-stage etching, the dielectric of the maximum film thickness in the active region does not have to be removed completely by dry etching. This brings about an advantage that a rule for the etch selectivity of the stopper film to dry etching can be relaxed.

The method of the eighth aspect can achieve similar effect to that of the seventh aspect.

Especially, since the predetermined etch selectivity is set not less than a value obtained by dividing twice a value which is obtained by subtracting a value equivalent to twice the amount of wet etching at the step (e) from a value equivalent to the distance from the bottom of the trench to the surface of the stopper film, by a value equivalent to the film thickness of the stopper film. Thus, not less than one half of the dielectric can be left after the step (e). This brings about the effect that the stopper film can sufficiently fulfill its function at the step (g) in which the dielectric is removed by polishing.

The semiconductor device with a trench type element isolation structure of the ninth aspect is formed by a manufacturing method that achieves the effect of the first aspect. Thus, this semiconductor device has no depression at an edge portion of the trench type element isolation, which avoids imperfections in device characteristics due to such a depression. Further, this semiconductor device is manufactured with high yield by the method of the first aspect.

On the basis of the idea that the cause of the aforementioned problems (1) to (4) lies in insufficient function of the silicon nitride films 103 and 203 as a stopper film, the inventors of the present invention have performed considerable amount of research and found the fact that only at least one half of the conventional film thickness is enough for the silicon nitride film 103 or 203 to sufficiently act as a stopper film in polishing by the CMP method. Also, they have found various conditions to achieve this fact.

The present invention aims to solve the conventional problems (1) to (4). An object of the present invention is to provide a method of forming a trench type element isolation structure that provides no depression of a dielectric in the trench and causes no damage on the substrate, during a process of palatalizing a film formed by a film formation method, such as an HDP-CVD method, that performs etching and deposition at the same time.

Besides the aforementioned object, another object of the present invention is to provide a method of manufacturing a semiconductor device with the trench type element isolation structure, while improving yield.

These and other objects, features, aspects and advantages of the present invention will become more apparent from the following detailed description of the present invention when taken in conjunction with the accompanying drawings.

DESCRIPTION OF THE PREFERRED EMBODIMENTS

1. First Preferred Embodiment

Figure 1:
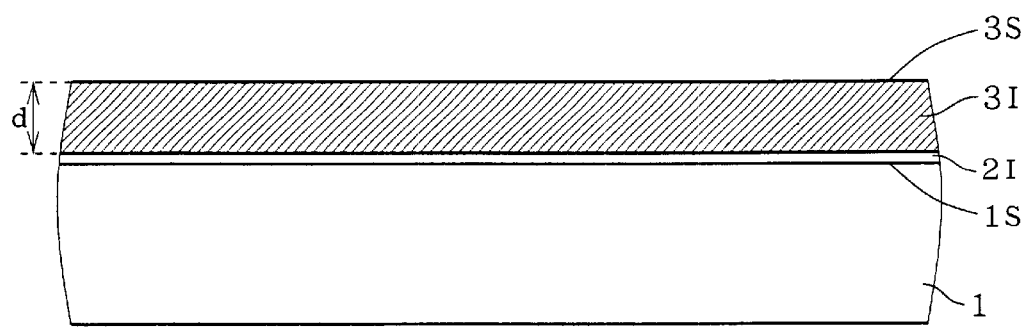
FIGS. 1 to 11 are longitudinal cross-sectional views of a semiconductor device, showing sucessive stages of a method of manufacturing the device according to a first preferred embodiment.

FIGS. 1 through 11 are longitudinal cross-sectional views of a semiconductor device, showing successive stages of a method of manufacturing the device according to a first preferred embodiment of the present invention. Referring to the drawings, we will describe each manufacturing step.

1-1. First Step

First, as shown in FIG. 1, a silicon oxide film (or underlying oxide film) 2I having a thickness of about 5 to 30 nm is formed by thermal oxidation, on one surface 1S of a silicon substrate (or a semiconductor substrate) 1. Then, a silicon nitride film 3I having a film thickness d of about 100 to 300 nm is formed on the surface of the silicon oxide film 2I1.

The silicon nitride film 3I (or a silicon nitride film 3 to be described later) acts as a stopper film both in dry etching at the fifth step (first planarization) and in polishing by a CMP method at the seventh step (second planarization), as will be described later. Thus, the silicon nitride film 3I (or 3) is also referred to as a "stopper film 3I (or 3)".

1-2. Second Step

Figure 2:
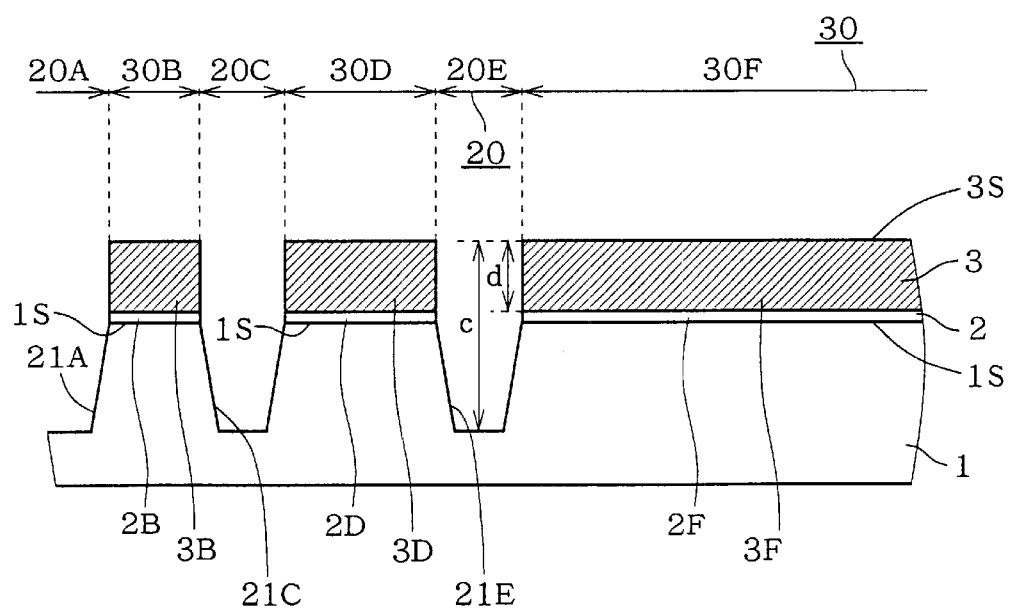

In predetermined regions to be element isolation regions 20A, 20C, or 20E, the silicon nitride film (stopper film) 3I, the underlying oxide film 2I, and part of the silicon substrate 1 (in the range of the surface 1S to the depth of 100 to 500 nm) are anisotropically etched, as shown in FIG. 2, from the surface 3S of the silicon nitride film 3I to the inside of the silicon substrate 1, using a photolithography pattern as a mask. This forms trenches 21A, 21C, and 21E (each referred to also as a trench 21) of a predetermined depth c. The silicon nitride film 3I includes silicon nitride films 3B, 3D, and 3F (each referred to also as a "silicon nitride film (stopper film) 3"), while the silicon oxide film 2I includes silicon oxide films 2B, 2D, and 2F (each referred to also as a "silicon oxide film (underlying oxide film) 2"). The depth c is defined as a distance from the bottom of the trench to the surface 3S of the silicon nitride film 3.

The trenches 21A, 21C and 21E form, in the silicon substrate 1, element isolation regions 20 including a plurality of regions 20A, 20C and 20E, and active regions 30 including a plurality of regions 30B, 30D and 30F, as shown in FIG. 2.

The concept of the element isolation regions 20 and the active regions 30 includes not only a two-dimensional region on the surface 1S of the silicon substrate 1 but also a three-dimensional region in a direction perpendicular to the surface 1S of the silicon substrate 1. That is, the silicon substrate 1 is divided into two types of regions, namely the element isolation regions 20 and the active regions 30. In the following description, regions except the element isolation regions 20 indicate the active regions 30.

In the following drawings, when there is a necessity to distinguish between each of the element isolation regions 20 or between each of the active regions 30, an additional English alphabet is attached to the reference numeral of each region, for example, the element isolation regions 20A, 20C, 20E or the active regions 30B, 30D, 30F. Similarly, the same component in each element isolation region 20 or in each active region 30 is distinguished by attaching the alphabet of each region to the reference numeral thereof.

1-3. Third Step

Figure 3:
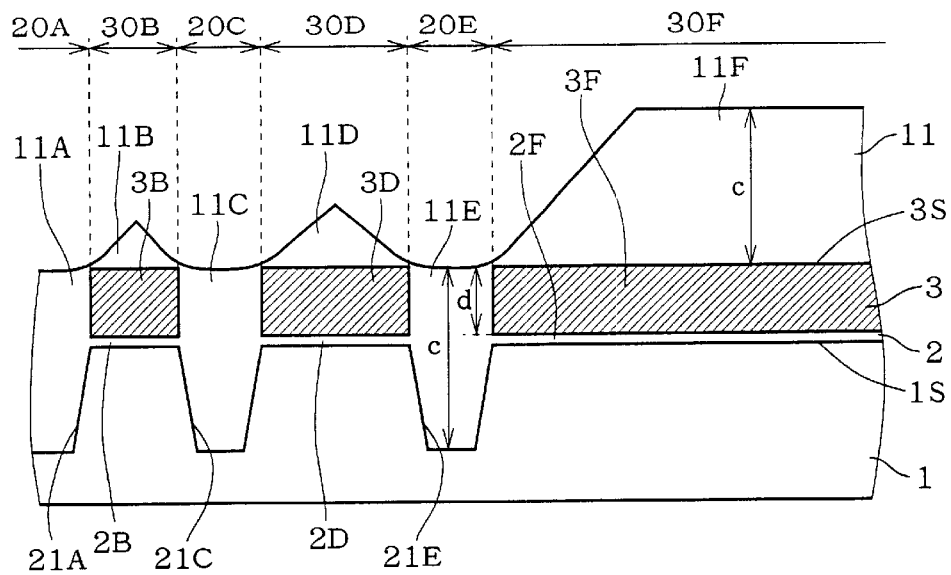

Next, as shown in FIG. 3, dielectric silicon oxides 11 are formed on the surface 3S of the silicon nitride films 3 and inside the trenches 21 by a film formation method, such as a HDP-CVD (High Density Plasma-Chemical Vapor Deposition) method, that performs etching and deposition at the same time, to fill the trenches 21 with the silicon oxides 11. That is, the trenches 21A, 21C and 21E are filled with silicon oxides 11A, 11C and 11E, respectively, to the level of the surface 3S of the silicon nitride films 3. At this time, the height c of the silicon oxides 11A, 11C and 11E, i.e., the depth of the trenches 21, is about 205 to 830 nm. We hereinafter call the silicon oxides 11 buried in the trenches 21, "buried oxides 11A, 11C and 11E (each referred to also as a" buried oxide 11"). By this film formation method, it becomes possible to fill the trenches 21 with the silicon oxides 11 without "key-hole" shaped cross-sectional void (seam).

The silicon oxides 11 formed on the surface 3S of the silicon nitride films 3 in the active regions 30 have characteristic section shapes, as shown in FIG. 3, due to the property of the film formation method that performs etching and deposition at the same time. At this time, the maximum film thickness of the silicon oxides 11 shown in FIG. 3 is equivalent to the depth c of the trenches 21 (or the height of the buried oxides 11). We hereinafter call the silicon oxides 11B, 11D, and 11F formed on the silicon nitride films 3B, 3D and 3F in the active regions 30B, 30D and 30F, respectively, "silicon oxide films 11B, 11D and 11D (each referred to also as a silicon oxide film 11)". Thus, the silicon oxides 11 can be distinguished between the buried oxides 11 and the silicon oxide films 11.

In the following description, the HDP-CVD method is used as an example to form the silicon oxides 11.

1-4. Fourth Step

Figure 4:
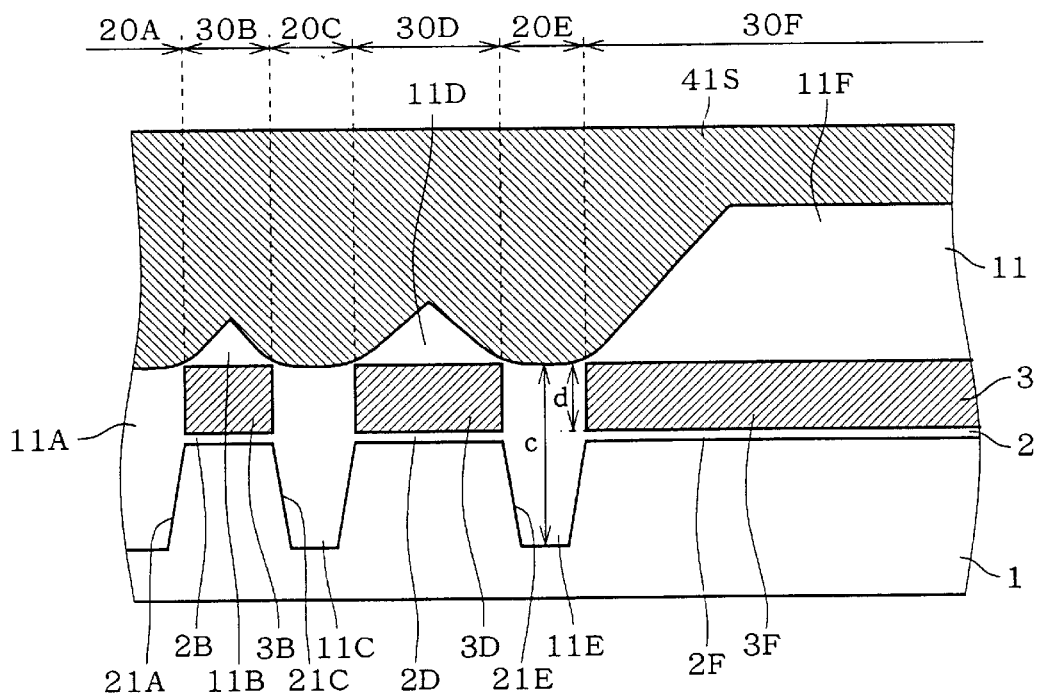

Next, as shown in FIG. 4, a resist 41S is formed on the overall surface of the silicon oxides 11. The resist 41S is then patterned by means of photolithography.

Figure 5:
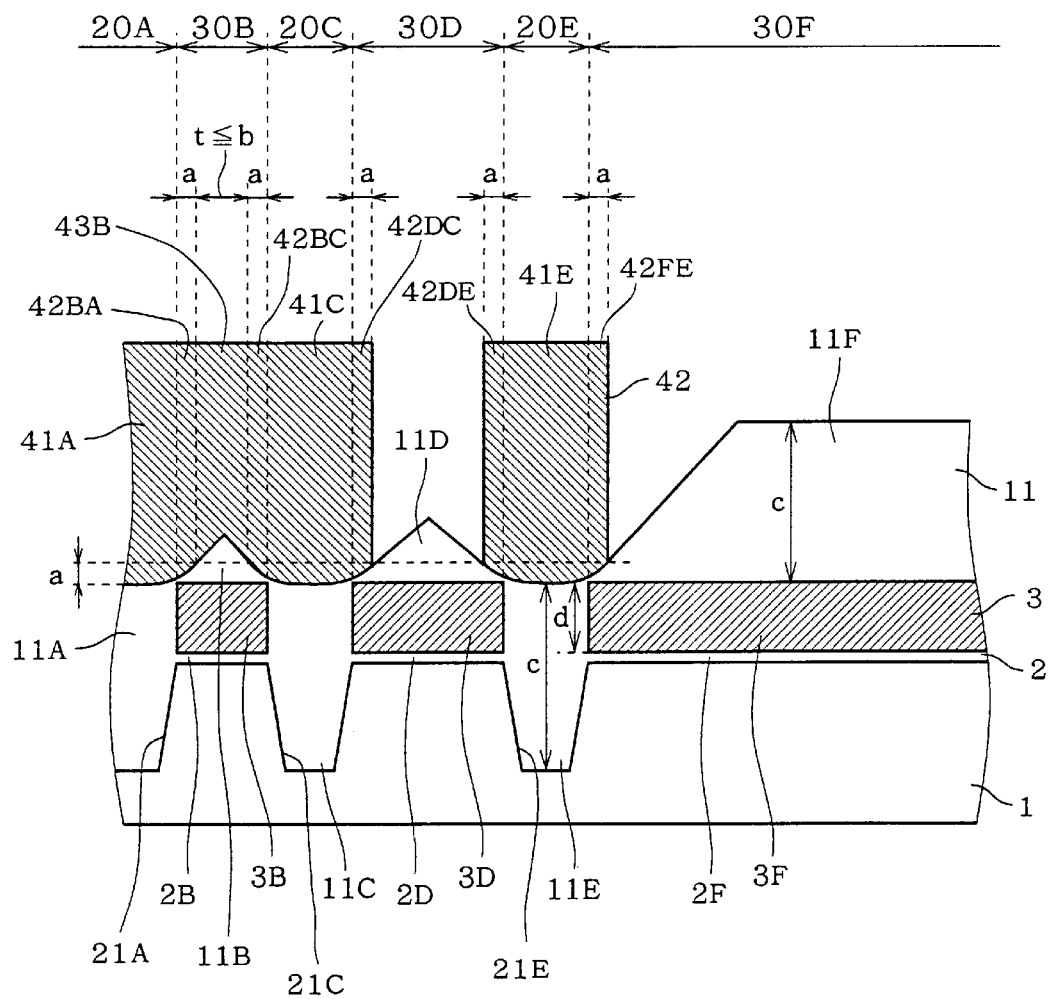

More specifically, the resist 41S is patterned to form resists 41A, 41C and 41E, as shown in FIG. 5, on the buried oxides 11 in the element isolation regions 20, and on the silicon oxide films 11 in the active regions 30 that range from the edge of the element isolation region 20 to an alignment margin a. Portions of the resists 41 that protrude from each edge of the element isolation regions 20 within a range of the alignment margin a, are referred to as "second resist portions 42BA, 42BC, 42DC, 42DE and 42FE (each referred to also as a second resist portion 42)". According to the method of the first preferred embodiment, since the resists 41 include the second resist portions 42, the buried oxides 11 can be always covered with the resists 41, even with misalignment (up to the maximum of a).

Especially with respect to a small active region 30, for example, the active region 30B, if the formation of the second resist portions 42BA and 42BC makes the width t of the active region 30B not more than the minimum design size b of the semiconductor device (for simplicity, t=b in the following description), a resist 43B is further formed in the active region 30B. In other words, when the size of the active region 30 (30B) is not more than the total (2a+b) of twice the alignment margin a and the minimum design size b of the semiconductor device, the resist 43 (43B) is further formed on the surface of the silicon oxide 11 in that active region 30 (30B). Thus, there is no possibility that a pattern not more than the minimum design size b will be formed. This brings about the effect of avoiding the necessity of relaxing the design rule.

1-5. Fifth Step

Figure 6:
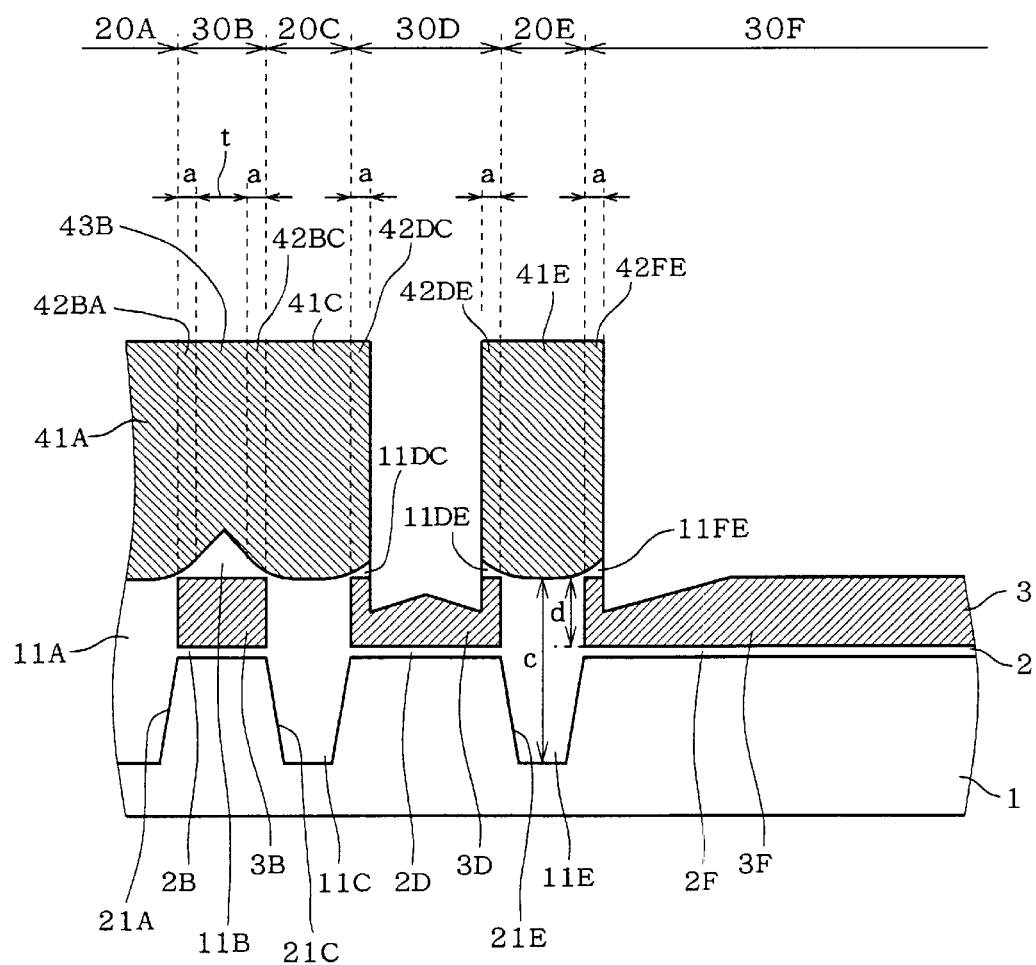

With the resists 41 and 43 used as masks, as shown in FIG. 6, the silicon oxide film 11 in the active region 30 that is not covered with those resists (cf. FIG. 5) are dry etched and removed using, for example, $C_4F_8$ gas. This process of removal is referred to as "first planarization". In the method of the first preferred embodiment, the stopper film 3 is resistant to dry etching of the silicon oxide film 11, and etch selectivity of the silicon oxide film 11 to the stopper film 3 is set not less than a value $\{2(c-a)/d\}$ obtained by dividing twice a value (c−a) by the film thickness d of the stopper film 3. The value (c−a) is obtained by subtracting the alignment margin a from the maximum film thickness c of the silicon oxide film 11 (i.e., the depth of the trench 21 or the height of the buried oxide 11, in FIG. 5). Such etch selectivity can be set by further strengthening selective deposition in dry etching with $C_4F_8$ gas.

According to the method of the first preferred embodiment, since dry etching is performed by the etch selectivity, the silicon oxide film 11 of the maximum film thickness c (e.g., the silicon oxide film 11F in FIG. 5) can be completely etched. Besides, even if the stopper film 3 is partially etched in a region where the silicon oxide film 11 has a film thickness of not more than the maximum film thickness c, since the etch selectivity is set as described above, at least about d/2 thick stopper film 3 will remain as shown in FIG. 6. Thus, there occurs no excessive etching of the silicon substrate 1, such as the overetching 251D and 251F as found in the aforementioned second conventional technique.

1-6. Sixth Step

Figure 7:
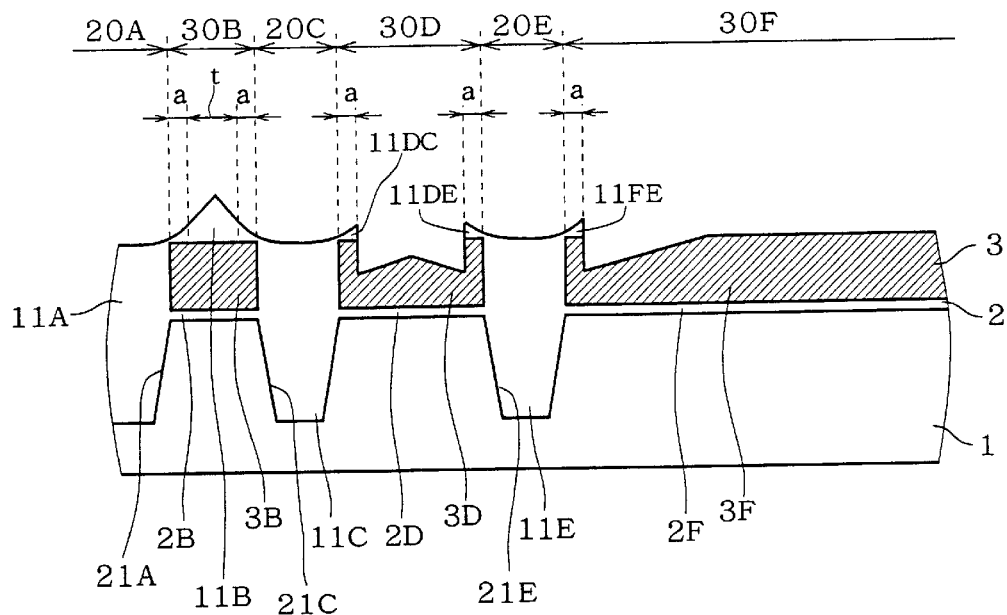

At the sixth step, as shown in FIG. 7, the resists 41 and 43 are removed to expose the silicon oxides (silicon oxide films and buried oxides) 11 covered with those resists of FIG. 6.

1-7. Seventh Step

Figure 8:
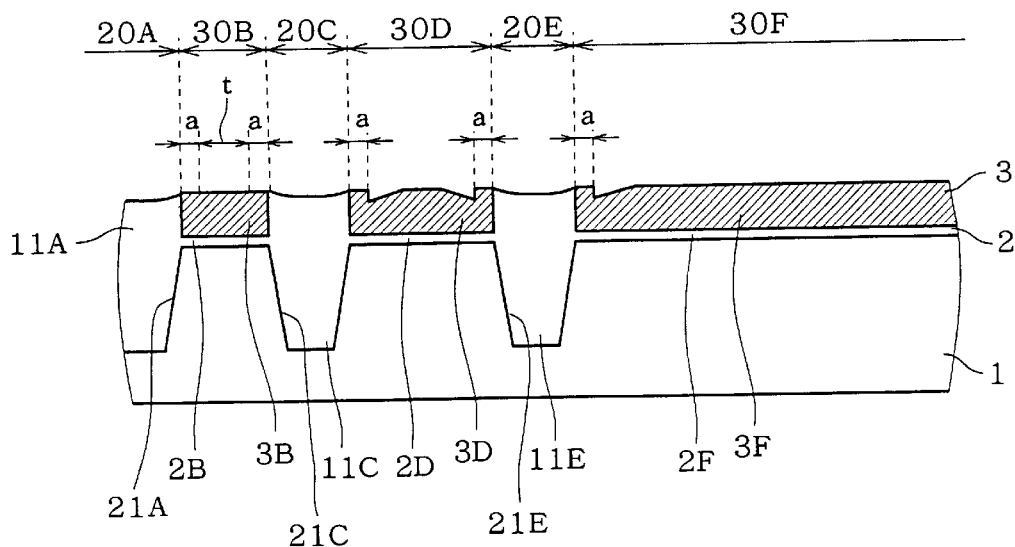

Then, the exposed silicon oxide films 11B, 11DC, 11DE and 11FE that remain in the active regions 30 are polished and removed by the CMP method (see FIG. 8). This process of removal is referred to as "second planarization".

At this time, the residual silicon nitride film 3 after the fifth step is approximately not less than d/2 in film thickness. Thus, the silicon nitride film 3 can sufficiently act as a stopper film in polishing by the CMP method.

Especially, according to the manufacturing method of the first preferred embodiment, the maximum height out of the heights of the silicon oxide films 11B, 11DC, 11DE and 11FE, namely the maximum amount to be polished at this seventh step, is equal to the height $\{(2a+b)/2\}$ of the silicon oxide film 11B covered with the resist 43. That is, the total amount to be polished is smaller than that in the first conventional technique. This shortens the polishing time as compared with the first conventional technique. Thus, the shape of the buried oxides 11 after polishing by the CMP method is independent of the patterns of the element isolation regions 20 and the active regions 30, and of the pattern of the residual silicon oxide films 11.

1-8. Eighth Step

Figure 9:
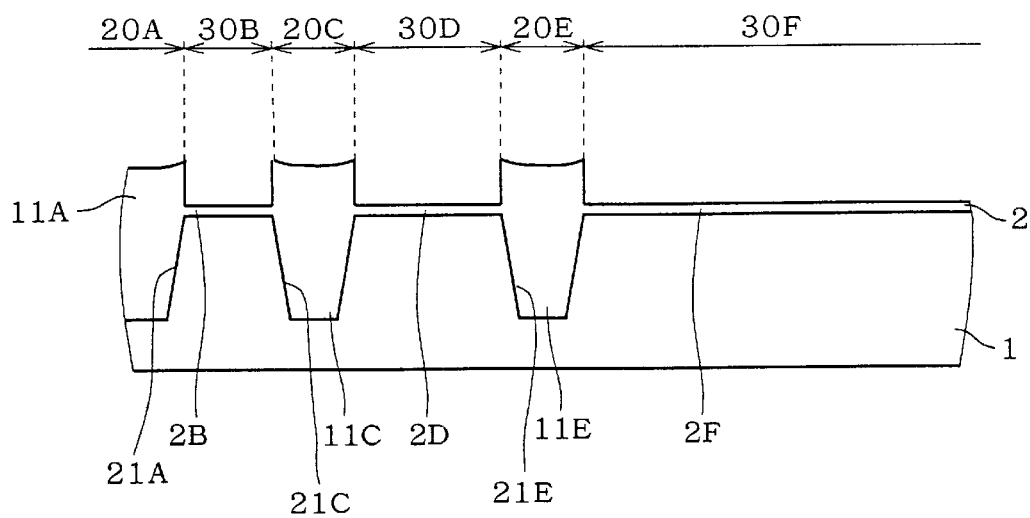
Figure 10:
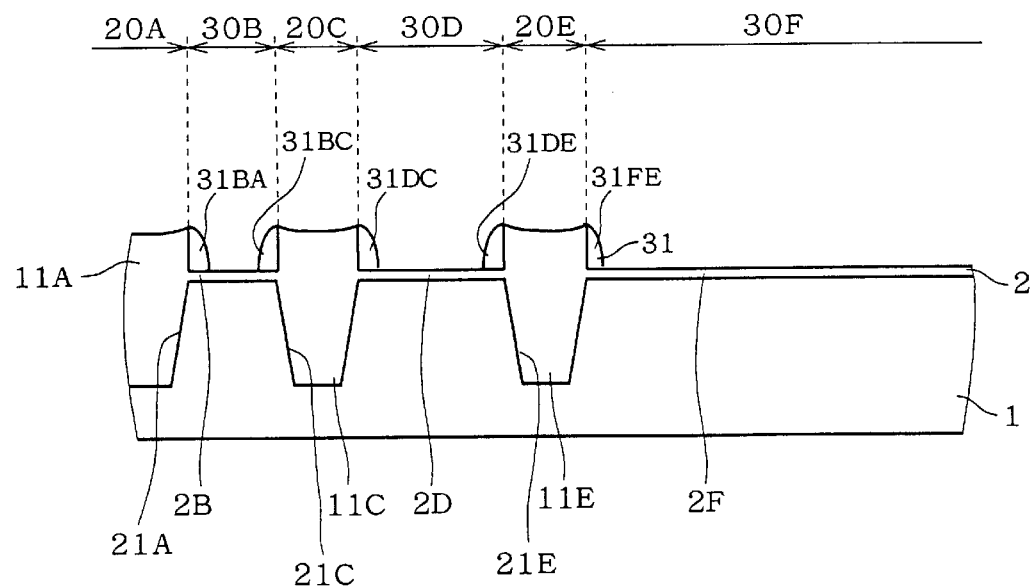

Next, the silicon nitride film 3 is removed using thermal phosphoric acid (see FIG. 9). Since the thermal phosphoric acid has considerably high etch selectivity of the silicon oxide to the silicon nitride, the underlying oxide film 2 and the buried oxides 11 are hardly etched.

1-9. Ninth Step

On the surfaces of the underlying oxide film 2 and the buried oxide 11 shown in FIG. 9, a silicon oxide film is formed, for example, by the CVD method. The silicon oxide film is then anisotropically etched to form sidewalls 31BA, 31BC, 31DC, 31DE and 31FE (each referred to also as a "sidewall 31") on the side walls of the buried oxides 11A, 11C, 11E that protrude above the surface of the underlying oxide films 2 (difference in level).

Figure 11:
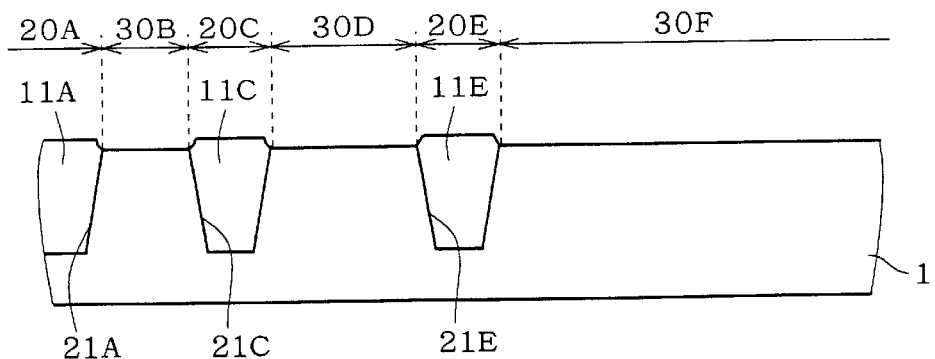

Then, the underlying oxide films 2 and the sidewalls 31 are removed by wet etching using hydrofluoric acid. This forms, in the trench 21, trench or wedge type element isolations each formed of the silicon oxide (buried oxide) 11 as shown in FIG. 11. The buried oxides 11 in FIG. 11 are also referred to as "trench or wedge type element isolations 11".

Figure 28:
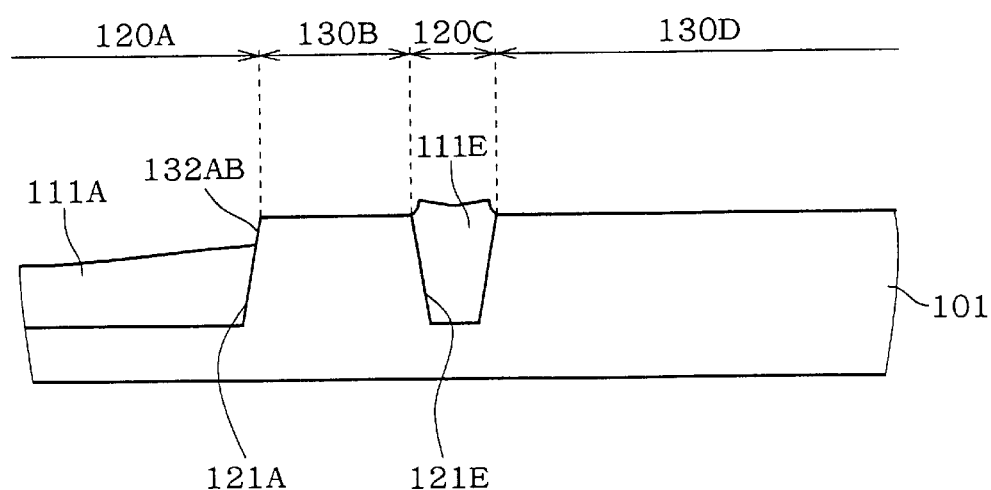
Figure 29:
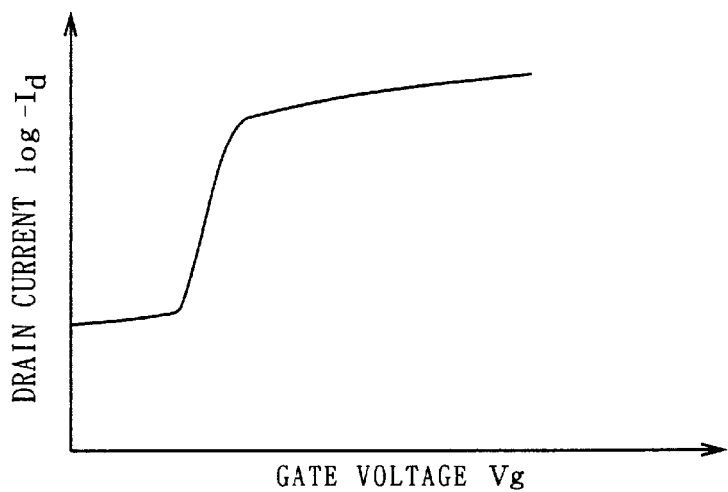
FIGS. 29 and 30 show device characteristics of a MOSFET.
Figure 30:
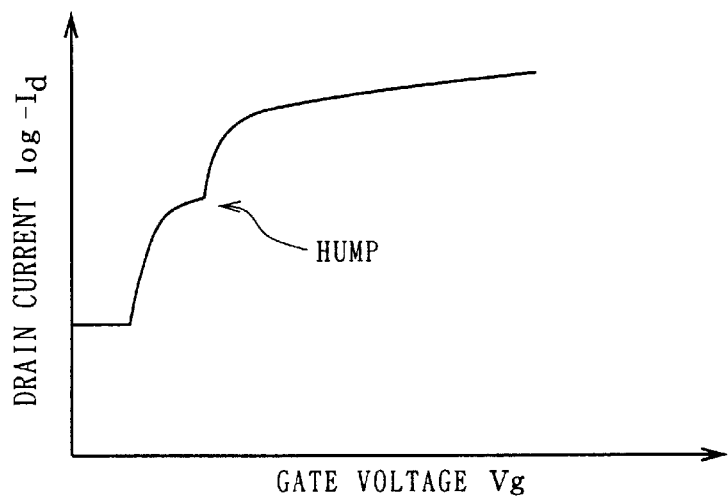
Figure 31:
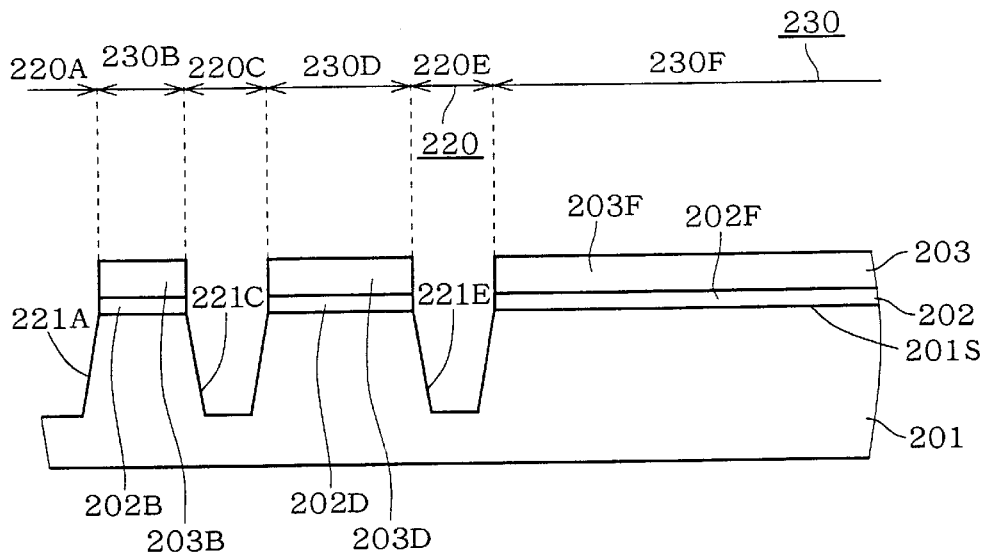
FIGS. 31 to 33 are longitudinal cross-sectional views of a semiconductor device, showing successive stages of a method of manufacturing the device according to a second conventional technique.
Figure 32:
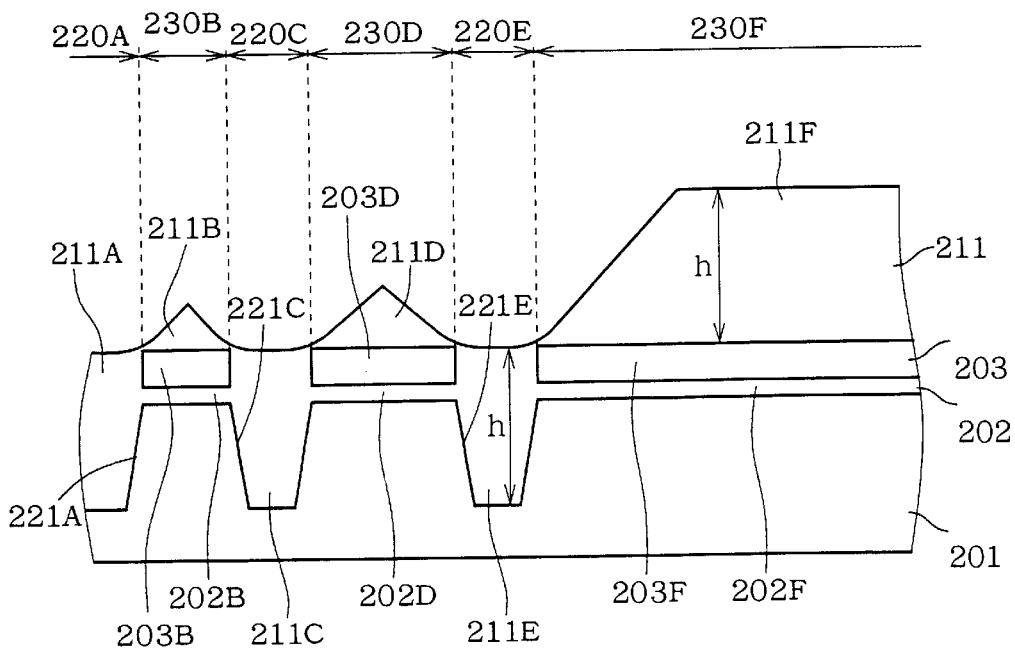

Especially, according to the method of the first preferred embodiment, since the side walls of the buried oxide 11 that protrude above the surface of the underlying oxide films 2 are of uniform and adequate height, the appropriate size of sidewalls 31 are provided thereat. Thus, the edge portions of the buried oxides 11 are fully protected by the sidewalls 31. This prevents generation of a depression, for example the depression 132AB at the edge portions of the buried oxide 11 in the large element isolation region 120A as shown in FIG. 28. Accordingly, the method of the first preferred embodiment permits the manufacture of the MOSFET that has no depression at the edge portion of the trench type element isolation 11, thereby causing no imperfection in device characteristics. The method further achieves high yield. Other semiconductor devices manufactured by this method can obtain the same effect as described above.

2. Second Preferred Embodiment

A manufacturing method according to a second preferred embodiment basically comprises similar steps to those in the method of the first preferred embodiment, but is characterized in the fourth and the fifth steps. Thus, we will give a focus on those steps. For the simplicity of description, the same reference numerals and characters indicate the same components as those in the first preferred embodiment.

2-1. First to Third Steps

The first through third steps of this method can be similar to those in the method of the first preferred embodiment. That is, as shown in FIG. 1, the underlying oxide layer 2I and the silicon nitride film 3I that has a film thickness of d and acts as a stopper film are sequentially formed on the surface 1S of the silicon substrate 1. Then, as shown in FIG.

2, the trenches 21 having a depth c are formed in the silicon substrate 1 from the surface 3S of the silicon nitride film 3I. After that, the silicon oxides 11 are formed by the HDP-CVD method to fill the trenches 21 with the buried oxides 11 as shown in FIG. 3.

2-2. Fourth Step

At this fourth step, after formed on the overall surface of the silicon oxides 11 (cf. FIG. 4), the resist 41S is patterned by means of photolithography.

Figure 12:
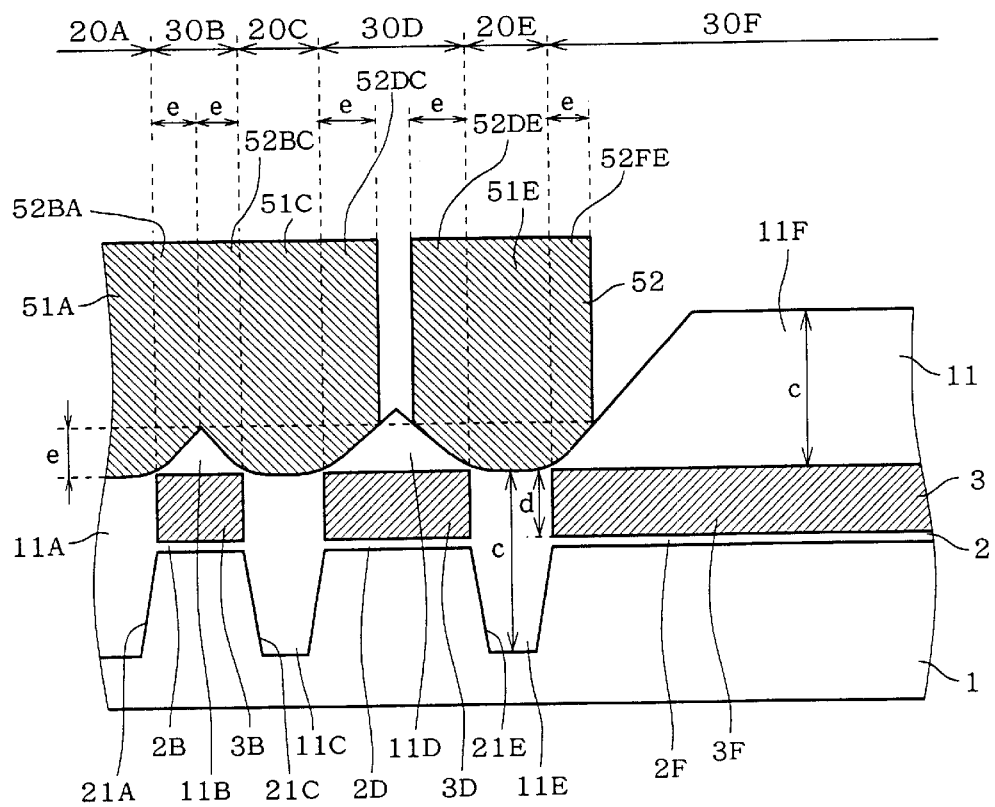
FIGS. 12 to 15 are longitudinal cross-sectional views of a semiconductor device, showing successive stages of a method of manufacturing the device according to a second preferred embodiment.

More specifically, as shown in FIG. 12, the resist 41S (cf. FIG. 4) is patterned to form resists 51 (51A, 51C, and 51E) on the buried oxides 11 in the element isolation regions 20, and on the silicon oxide films 11 in the active regions 30 that range from the edges of the element isolation regions 20 to a distance equivalent to the half value e of the minimum size 2e of the active regions 30 (30B). Especially, in this method, the half value e of the minimum size 2e is not less than the alignment margin a. Thus, even with misalignment (up to the maximum of a), the buried oxides 11 are fully covered with the resists 51. The aforementioned protruded portions of the resists 51 are referred to as "second resist portions 52BA, 52BC, 52DC, 52DE and 52FE (each referred to also as a "second resist portion 52")".

Further, if the size of an active region is not more than the total value (2e+b) of twice the half value e (i.e., the minimum size 2e) and the minimum design size b of the semiconductor device, as in the fourth step of the first preferred embodiment, a resist (corresponding to the resist 43 in FIG. 5) is further formed on the silicon oxide 11 in that active region. For the simplicity of drawings, however, such a resist is not shown in FIG. 12, and in the following description, it will be referred to only by using the description of the first preferred embodiment.

2-3. Fifth Step

Figure 13:
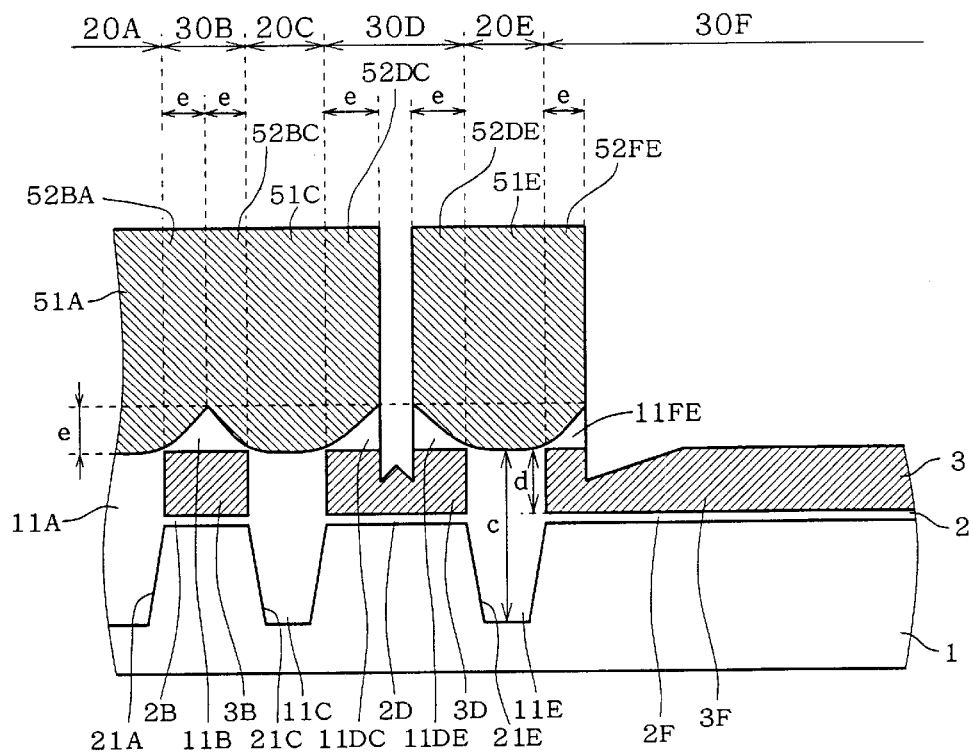

At this fifth step, with the resists 51 used as masks, the silicon oxide films 11 in the active regions 30 on which the resists 51 are not formed, are completely dry etched using, for example, $C_4F_8$ gas, to be removed as shown in FIG. 13 (first planarization).

According to the manufacturing method of the second preferred embodiment, the stopper film 3 is resistant to dry etching of the silicon oxide film 11, and etch selectivity of the silicon oxide film 11 to the stopper film 3 is set not less than a value $\{2(c-e)/d\}$ obtained by dividing twice a value $(c-e)$ by the film thickness d of the stopper film 3. The value $(c-e)$ is obtained by subtracting the half value e of the minimum size 2e of the active region 30 (30B) from the maximum film thickness c of the silicon oxide film 11 (i.e., the depth of the trench 21 or the height of the buried oxide 11). Such etch selectivity can be set by further strengthening selective deposition in dry etching with $C_4F_8$ gas.

Figure 33:
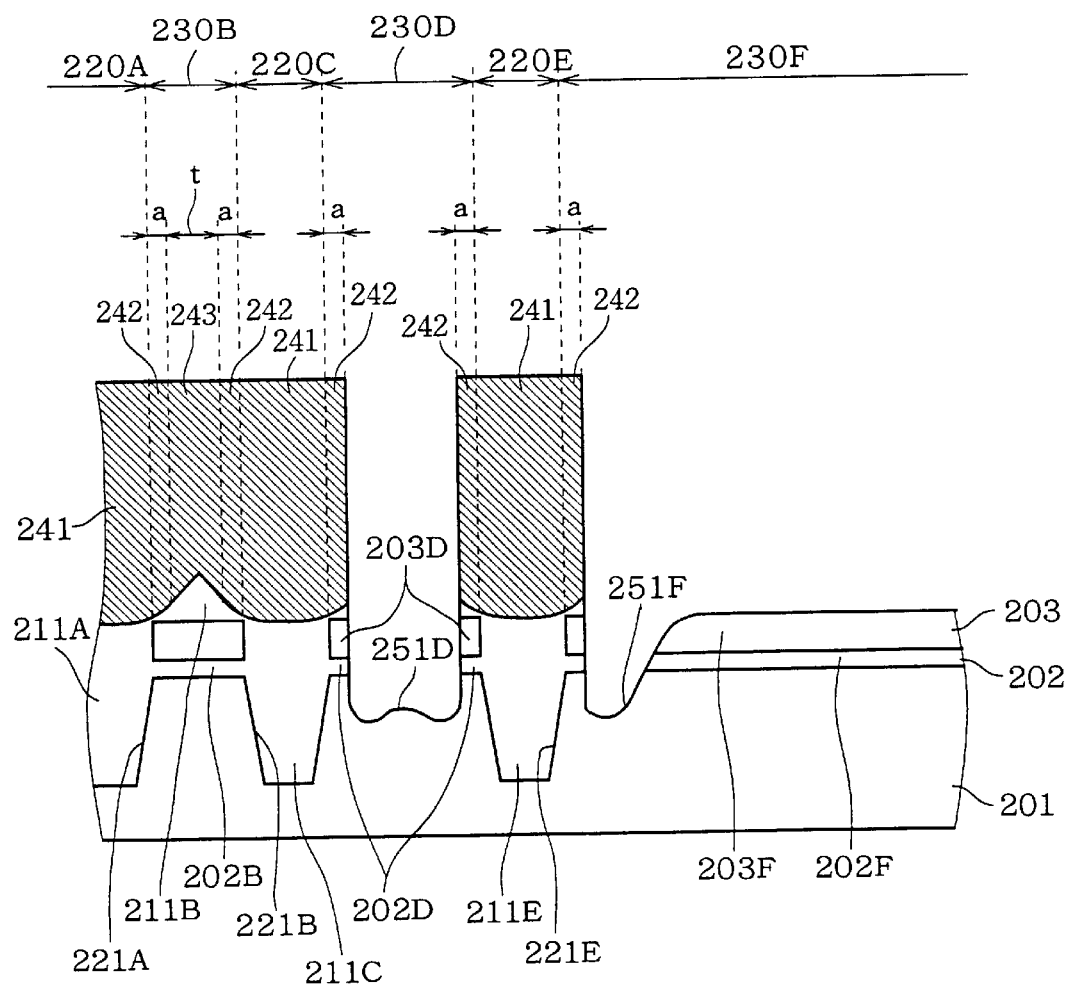
Figure 34:
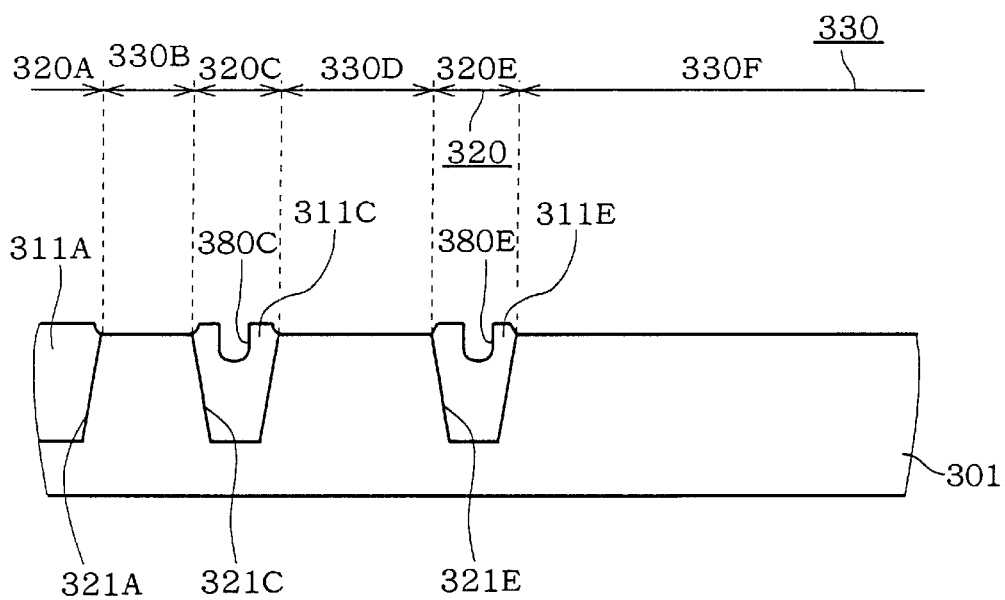
FIG. 34 is a longitudinal cross-sectional view of a semiconductor device according to the second conventional technique.
Figure 35:
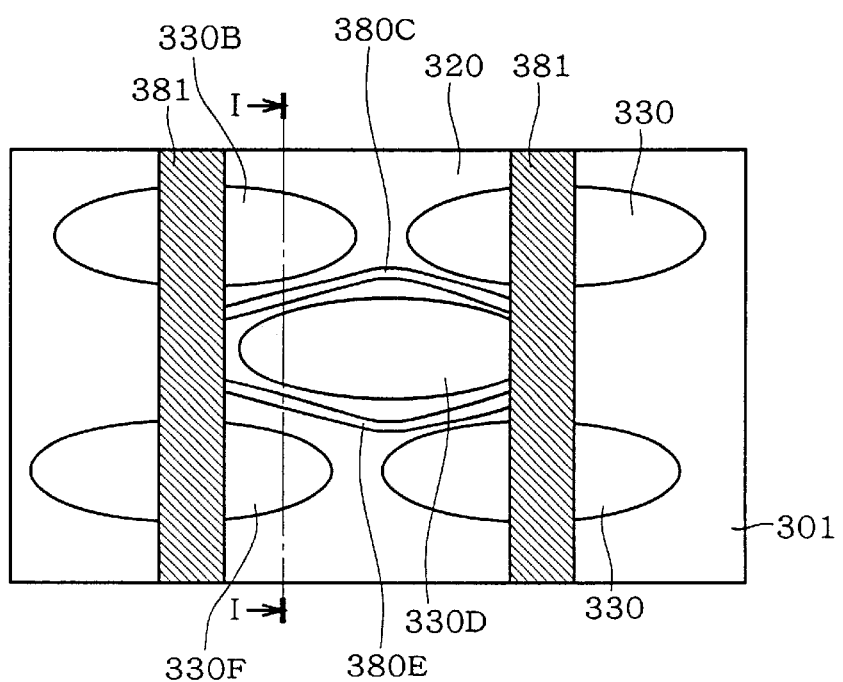
FIG. 35 is a top view of the semiconductor device according to the second conventional technique.

Since the dry etching is performed by the etch selectivity, the silicon oxide film 11 that has the maximum film thickness c (cf. the silicon oxide film 11F in FIG. 12) can be completely etched. Besides, even if the stopper film 3 is partially etched in a region where the silicon oxide film 11 has a film thickness of not more than c, at least about d/2 thick stopper film 3 will remain as shown in FIG. 13. This perfectly prevents excessive etching of the silicon substrate 1, such as the overetching 251D and 251F as is found in the aforementioned second conventional technique (cf. FIG. 33).

2-4. Sixth Step

Figure 14:
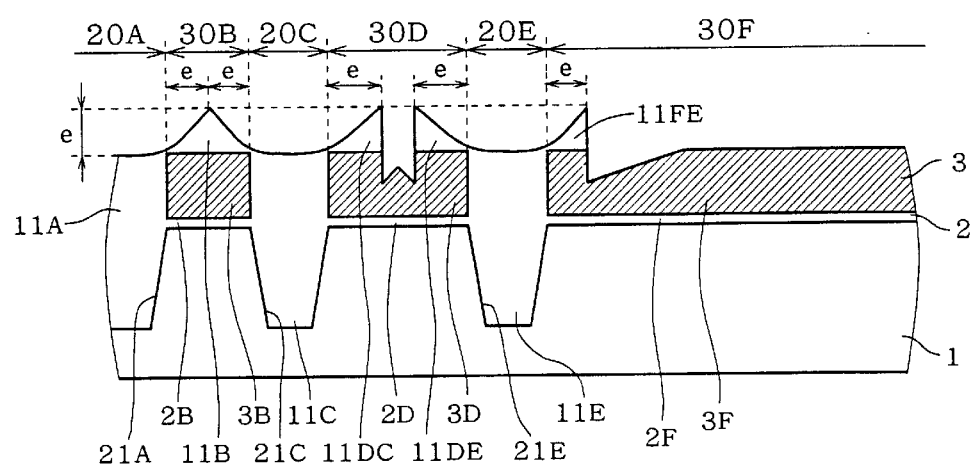

At the sixth step, as shown in FIG. 14, the resists 51 are removed to expose the silicon oxides (silicon oxide films and buried oxides) 11 covered with those resists of FIG. 13.

2-5. Seventh Step

Figure 15:
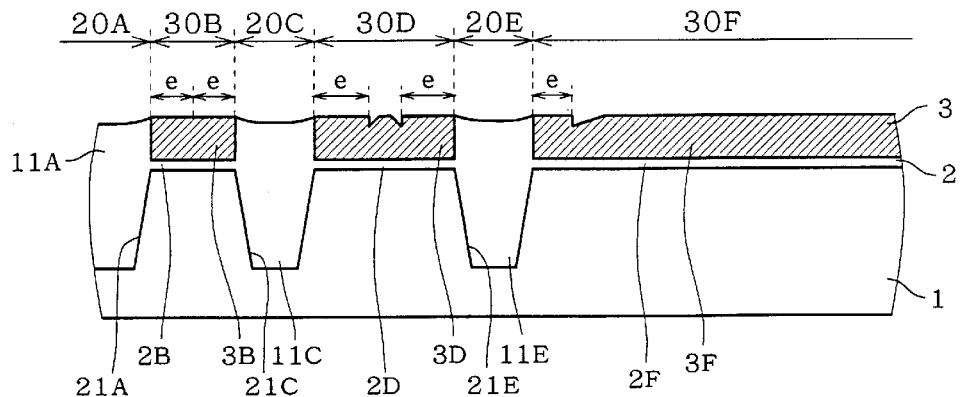

At the seventh step, the exposed silicon oxide films 11B, 11DC, 11DE and 11FE that remain in the active regions 30 are polished by the CMP method to be removed completely (cf. FIG. 15). This process of removal is referred to as "second planarization".

The residual silicon nitride films 3 after the fifth step are approximately not less than d/2 in thickness. Thus, the silicon nitride films can sufficiently act as stopper films in polishing by the CMP method.

Further, according to the manufacturing method of the second preferred embodiment, since the resists 51 include the second resist portions 52, because of the property of film formation by the HDP-CVD method, all the silicon oxide films 11B, 11DC, 11DE and 11FE which have been covered with the resists 51 at the fifth step are approximately of the height e as shown in FIGS. 13 and 14. Besides, since the heights of the silicon oxide films 11B, 11DC, 11DE and 11FE are almost uniform, the CMP method can get the most of its capability to polish the overall surface evenly. This considerably increases flatness and uniformity of the buried oxides 11 after polishing by the CMP method.

The total amount of polishing by the CMP method is, of course, smaller than that in the first conventional technique, so that the polishing time can be shorten. Thus, the shape of the buried oxide 11 after polishing by the CMP method is independent of the patterns of the element isolation regions 20 and the active regions 30 and of the pattern of the residual silicon oxide films 11. Further, there is no depression at the edge portions of the buried oxides 11.

2-6. Eighth and Ninth Steps

The eighth and the ninth steps of this method can be similar to those of the first preferred embodiment. That is, after the silicon nitride films 3 are removed using thermal phosphoric acid, the sidewalls 31 are formed (see FIG. 10). After that, the underlying oxide films 2 and the sidewalls 31 are removed by wet etching to form the trench or wedge type element isolations 11 (see FIG. 11).

In this fashion, according to the manufacturing method of the second preferred embodiment, the depression 132AB shown in FIG. 28 is not generated for the same reason as described in the first preferred embodiment. Thus, the semiconductor device manufactured by this method can obtain the same effect as that of the semiconductor device of the first preferred embodiment.

3. Third Preferred Embodiment

A manufacturing method according to a third preferred embodiment basically has similar steps to those of the first preferred embodiment. The method is, however, characterized by the fifth step at which the first planarization combines dry etching and wet etching, for the removal of the silicon oxide films 11 (see FIG. 16). We will give the following description with particular emphasis on this point. The same reference numerals and characters indicate the same components as those of the first preferred embodiment.

3-1. First to Third Steps

The first through third steps of this method can be similar to those of the first preferred embodiment. That is, as shown in FIG. 1, the underlying oxide film 2I and the silicon nitride film 3I which has a thickness d and acts as a stopper film, are sequentially formed on the surface 1S of the silicon substrate 1. Then, as shown in FIG. 2, the trenches 21 having a depth c are formed in the silicon substrate 1 from the surface 3S of the silicon nitride film 3I. After that, the silicon oxides 11 are formed by the HDP-CVD method to fill the trenches 21 with the buried oxides 11, as shown in FIG. 3.

3-2. Fourth Step

At the fourth step, after formed on the overall surface of the silicon oxide 11, the resist 41S is pattern by means of photolithography (cf. FIG. 4).

Figure 16:
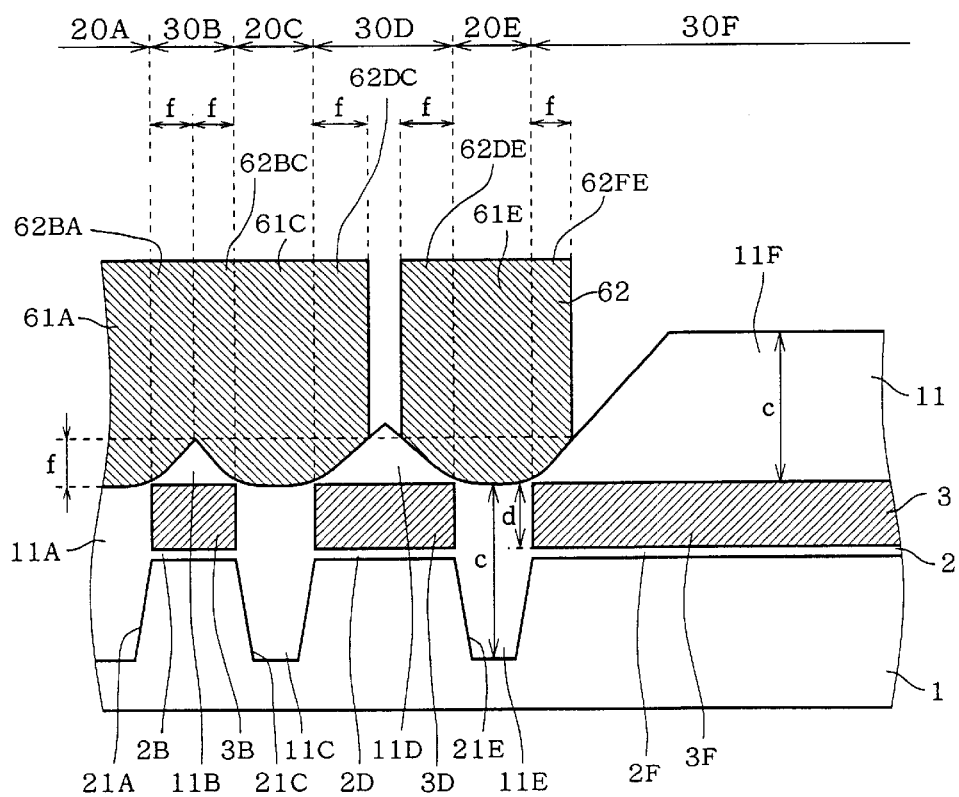
FIGS. 16 to 20 are longitudinal cross-sectional views of a semiconductor device, showing successive stages of a method of manufacturing the device according to a third preferred embodiment.

More specifically, as shown in FIG. 16, the resist 41S is patterned to form resists 61 (61A, 61C, and 61E) on the buried oxides 11 in the element isolation regions 20, and on the silicon oxide films 11 in the active regions 30 that range from each edge of the element isolation regions 20 to a distance equivalent to the amount of wet etching f at the seventh step which will be described later. Especially, in this method, the amount of wet etching f is not less than the alignment margin a. Thus, even with misalignment (up to the maximum of a), the buried oxides 11 can be fully covered with the resists 61. The aforementioned protruded portions of the resists 61 are referred to as "second resist portions 62BA, 62BC, 62DC, 62DE and 62FE (each referred to also as a "second resist portion 62")".

If the size of an active region is not more than the total value (2f+b) of twice the amount of wet etching f, and the minimum design size b of the semiconductor device, as in the fourth step of the first preferred embodiment, a resist (corresponding to the resist 43 in FIG. 5) is further formed on the surface of the silicon oxide 11 in that active region. For the simplicity of drawings, however, such a resist is not shown in FIG. 16, and in the following description, it is referred to only by using the description of the first preferred embodiment.

3-3. Fifth Step

At this fifth step (corresponding to the first planarization), first, the silicon oxide film 11 in the active region 30 that is not covered with the resist 61 is partially etched by dry etching. Then, the residual silicon oxide film 11 in that active region 30 is removed by wet etching. The detail is given below.

Figure 17:
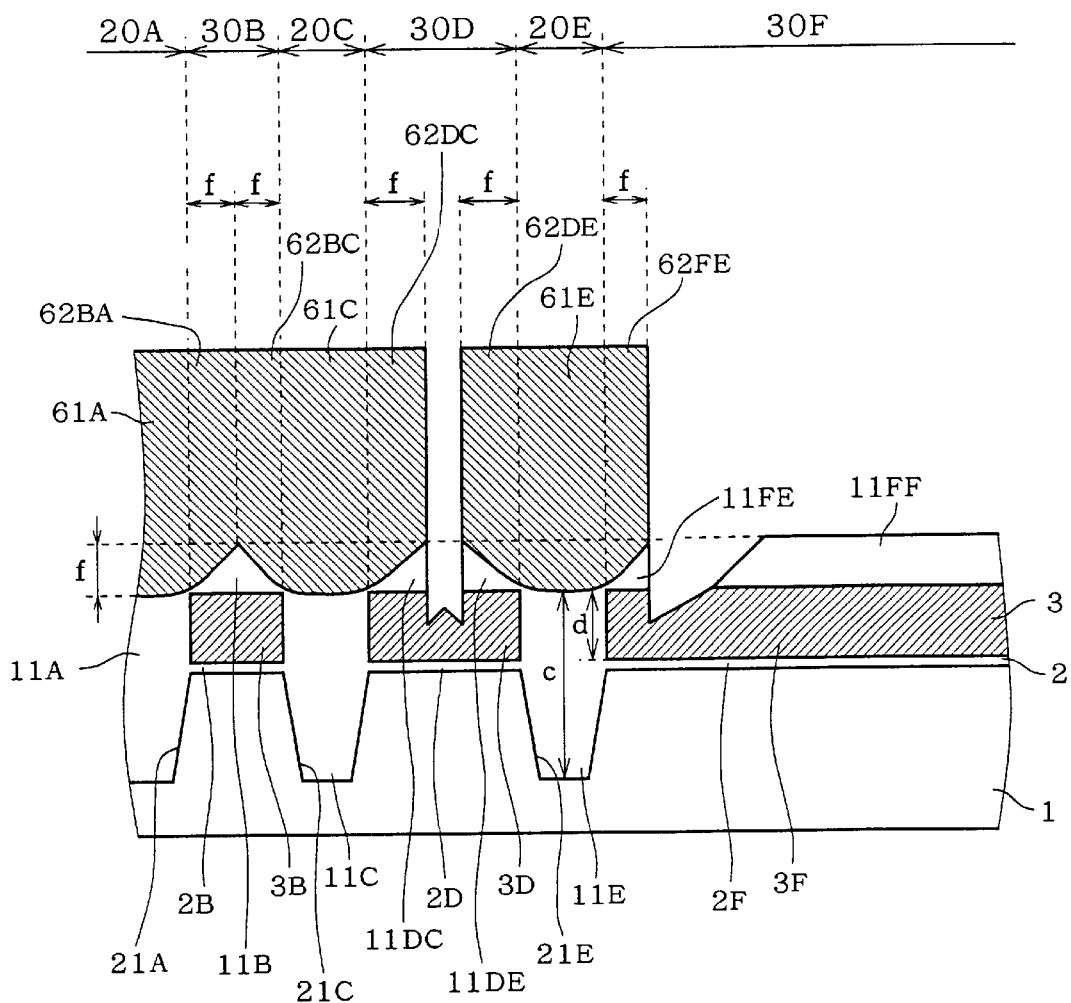

First, as shown in FIG. 17, only the silicon oxide film 11 in the active region 30 that is not covered with the resist 61, is dry etched using, for example, $C_4F_8$ gas, with the resist 61 used as a mask. This dry etching continues until the maximum film thickness c of the silicon oxide film 11 (cf. the silicon oxide film 11IF in FIG. 16) is reduced to f (cf. the silicon oxide film 11FF in FIG. 17).

According to the manufacturing method of the third preferred embodiment, the stopper film 3 is resistant to dry etching of the silicon oxide film 11, and etch selectivity of the silicon oxide film 11 to the stopper film 3 is set not less than a value $\{2(c-2f)/d\}$ obtained by dividing twice a value (c−2f) by the film thickness d of the stopper film 3. The value (c−2f) is obtained by subtracting a value 2f corresponding to twice the amount of wet etching f from the maximum film thickness d of the silicon oxide film 11 (i.e., the depth of the trench 21 or the height of the buried oxide 11). Such etch selectivity can be set by further strengthening selective deposition in dry etching with $C_4F_8$ gas.

After that, with the resist 61 used as a mask, wet etching using hydrofluoric acid is applied to the semiconductor device in the state shown in FIG. 17. This removes the residual dry-etched silicon oxide film 11. More specifically, the residual silicon oxide film 11FF in the active region 30F, shown in FIG. 17, is removed (cf. FIG. 18). Since the wet etching is isotropic etching, by utilizing this property, the residual silicon oxide films 11DC, 11DE and 11FE in the active regions 30, that are located under the second resist portions 62DC, 62DE and 62FE shown in FIG. 17, respectively, are also removed simultaneously. Since the silicon nitride film 3 is resistant to wet etching of the silicon oxide 11, i.e., etch selectivity of the silicon oxide 11 to the silicon nitride film 3 is high, the silicon nitride film 3 will be hardly etched. This completely prevents excessive etching of the silicon substrate 1, such as the overetching 251D and 251F as is found in the aforementioned second conventional technique (cf. FIG. 33), when the silicon oxide film 11 is etched.

Thus, at the fifth step, while it is necessary to use a stopper film that is resistant to both dry etching and wet etching of the silicon oxide film 11, the method of the third preferred embodiment can meet this requirement by using the silicon nitride film 3 as a stopper film.

In this fashion, the first planarization of the silicon oxide film 11 is performed at the fifth step by two-stage etching that combines dry etching and wet etching. This avoids the necessity of removing the silicon oxide film 11F of the maximum film thickness c (cf. FIG. 16) completely by dry etching. Thus, the method of the third preferred embodiment has an advantage that a rule for the etch selectivity of the stopper film 3 to dry etching can be relaxed, as compared with the case where the first planarization of the silicon oxide films 11 is performed only by dry etching.

3-4. Sixth Step

Figure 18:
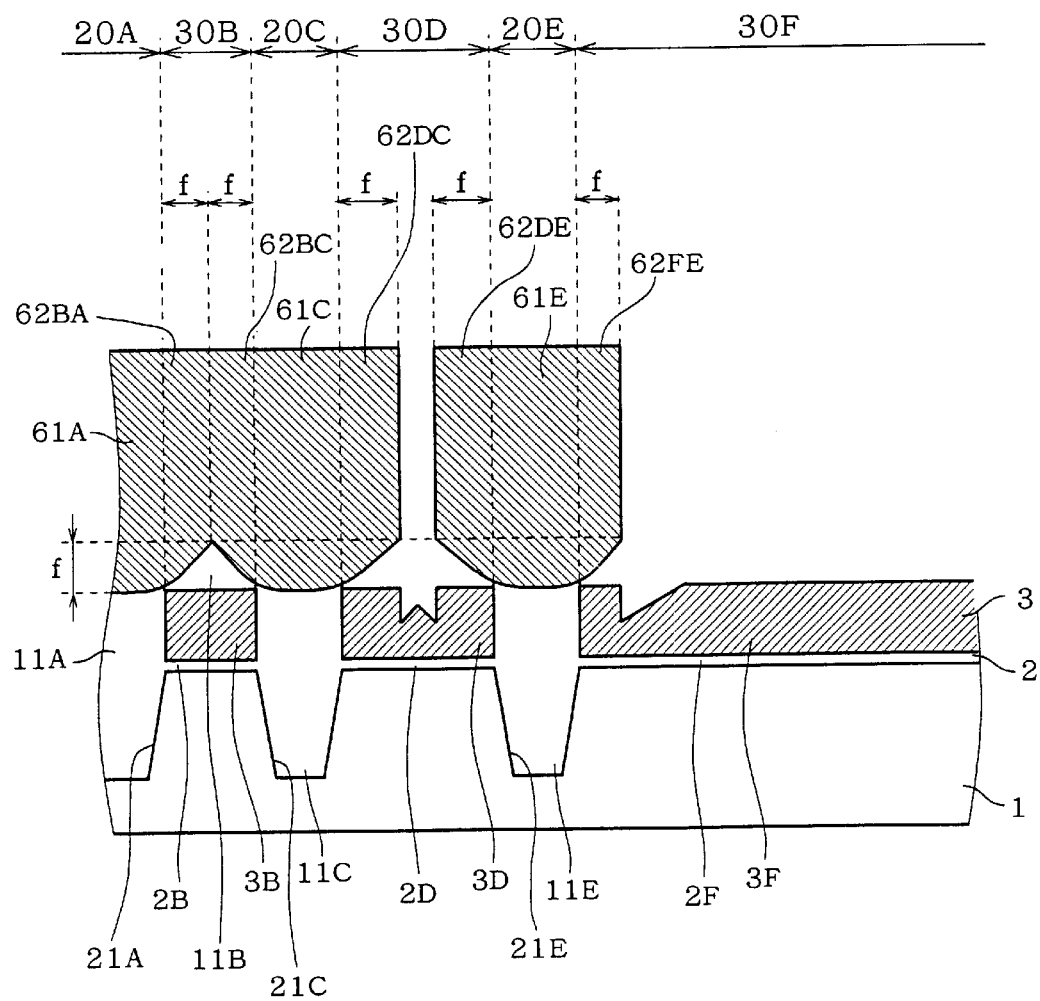
Figure 19:
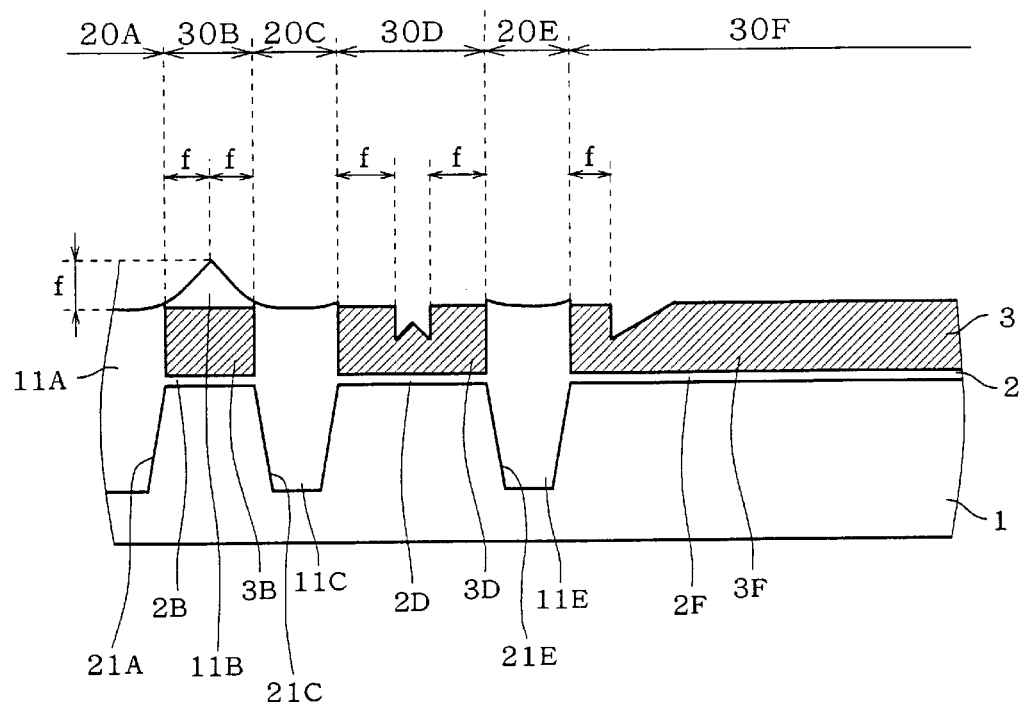

At the sixth step, as shown in FIG. 19, the resists 61 are removed to expose the silicon oxides 11, namely the silicon oxide films 11 and the buried oxides 11 covered with those resists of FIG. 18.

3-5. Seventh Step

Figure 20:
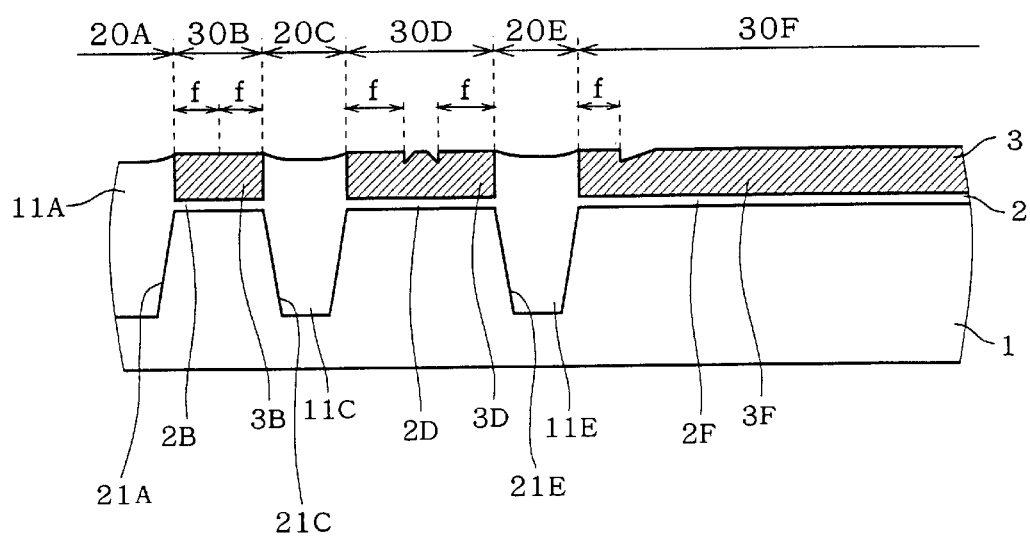
Figure 21:
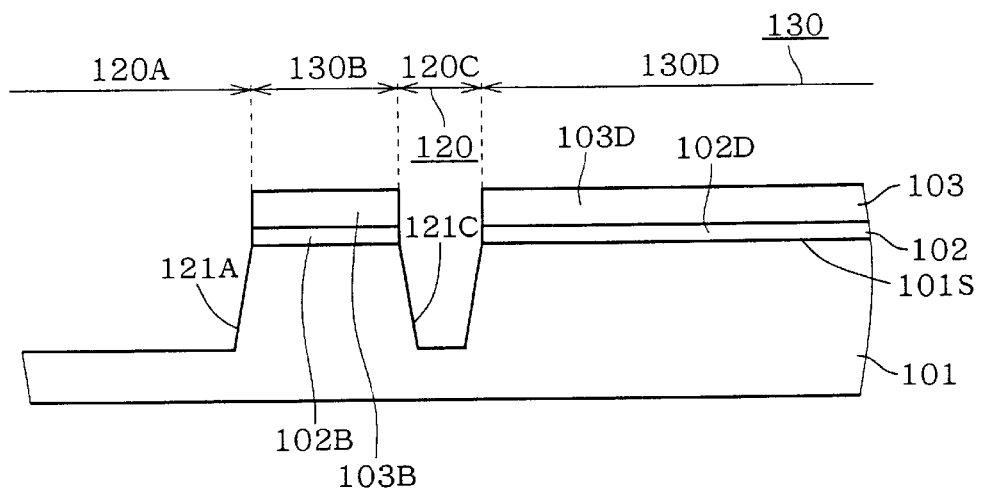
FIGS. 21 to 28 are longitudinal cross-sectional views of a semiconductor device, showing successive stages of a method of manufacturing the device according to a first conventional technique.
Figure 22:
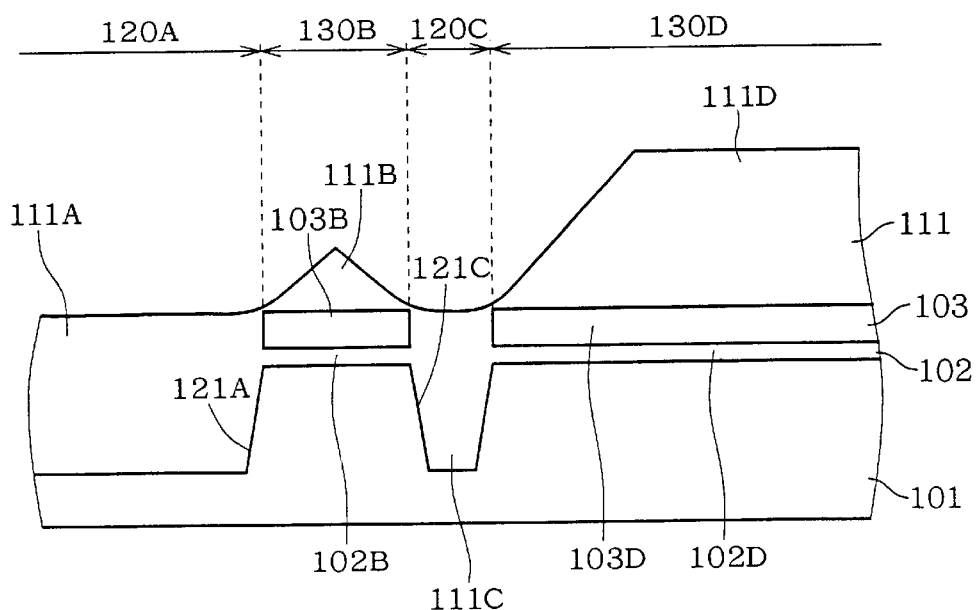
Figure 23:
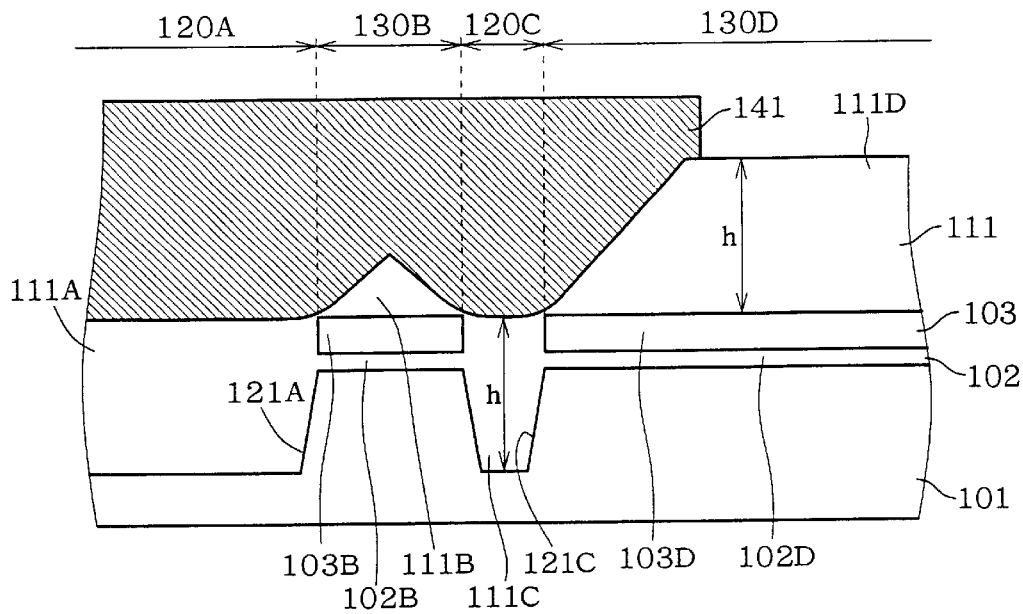
Figure 24:
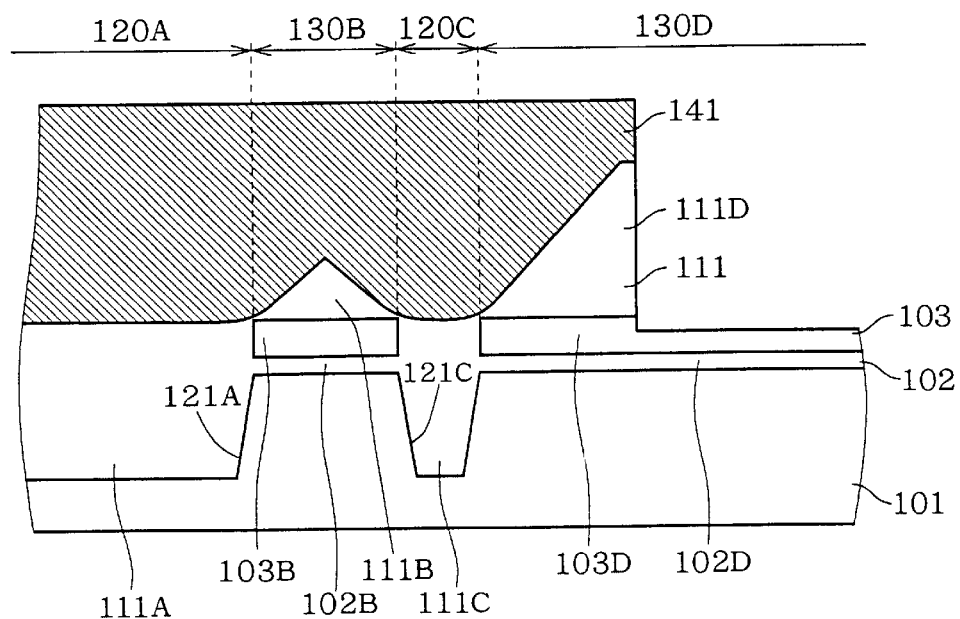
Figure 25:
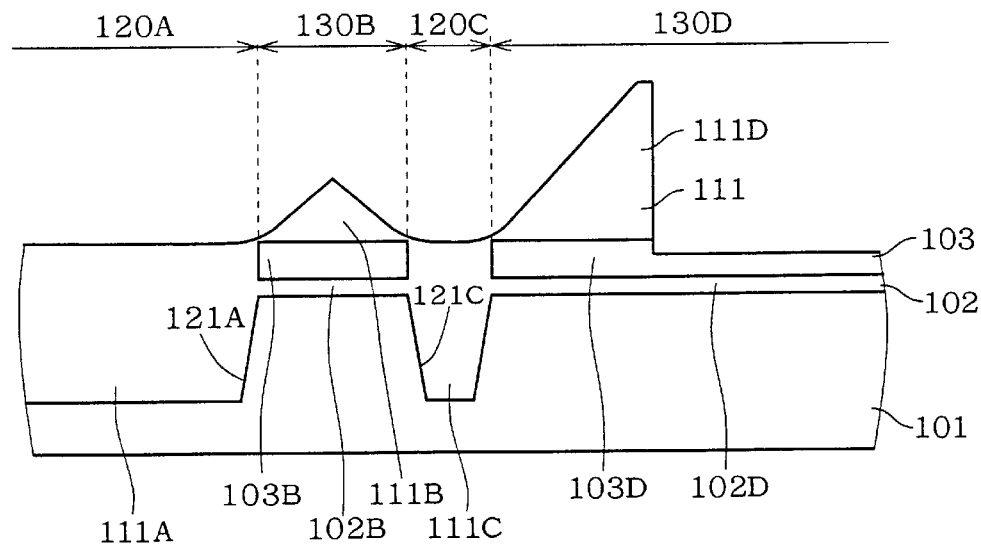
Figure 26:
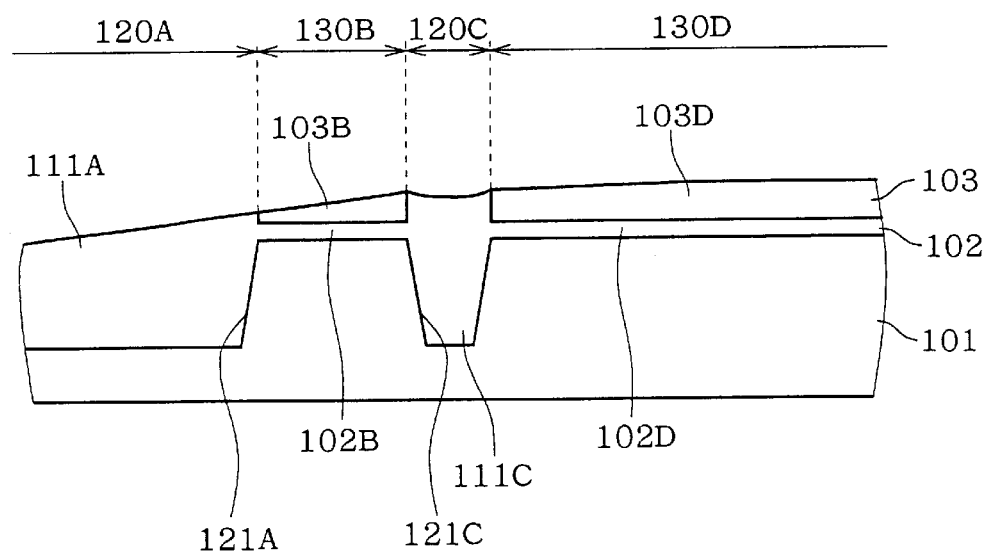
Figure 27:
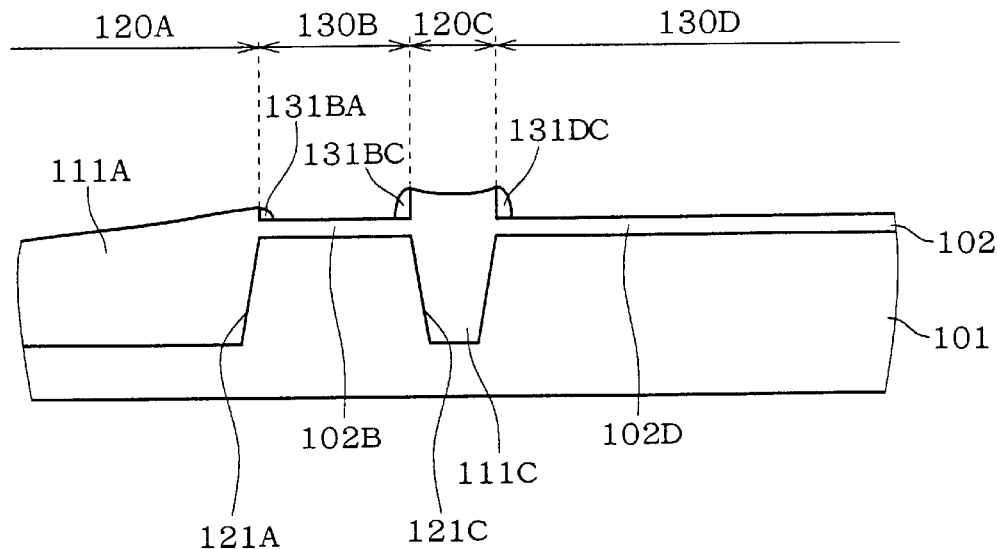

At the seventh step (corresponding to the second planarization), the exposed silicon oxide film 11 (11B) that remains in the active region 30 (30B) is polished by the CMP method to be removed (see FIG. 20).

Since the residual silicon nitride film 3 after the fifth step is approximately not less than d/2 in film thickness, the silicon nitride film 3 can sufficiently act as a stopper film in polishing by the CMP method.

Especially, according to the manufacturing method of the third preferred embodiment, the silicon oxide films 11DC, 11DE and 11FE (cf. FIG. 17) have already been removed by wet etching at the fifth step. Thus, only the silicon oxide film 11B which has been completely covered with the resist 61 remains after the fifth step. Besides, the residual silicon oxide film 11 (11B) is not more than f in height, so that the total amount of polishing is smaller than that in the first conventional technique. This reduces the polishing time in this method, as compared with the first conventional technique. Thus, the shape of the buried oxides 11 after polishing by the CMP method is independent of the patterns of the element isolation regions 20 and the active regions 30 and of the pattern of the residual silicon oxide films 11.

3-6. Eighth and Ninth Steps

The eighth and the ninth steps of this method can be similar to those of the first preferred embodiment. That is, after the silicon nitride film 3 is removed using thermal phosphoric acid, the sidewalls 31 are formed (see FIG. 10). Then, the underlying oxide films 2 and the sidewalls 31 are removed by wet etching to form the trench or wedge type element isolations 11 (see FIG. 11).

In this fashion, according to the manufacturing method of the third preferred embodiment, the depression 132AB shown in FIG. 28 is not generated for the same reason as described in the first preferred embodiment. Thus, the semiconductor device manufactured by this method can obtain the same effect as that of the semiconductor device of the first preferred embodiment.

In the aforementioned first through third preferred embodiments, the buried oxides 11 act as element isolations or have function to avoid electrical interference between elements formed in the adjacent active regions 30. Thus, the trenches 21 only have to be filled with dielectric which can be, for example, silicon oxy-nitride (SiON) formed by the HDP-CVD method, instead of the silicon oxides 11. Further, when the stopper film 3 is appropriately selected, the dielectric can be silicon nitride.

Similarly, the semiconductor substrate 1 is not limited only to the silicon substrate, but may be formed of other base members as far as the trench type element isolations 11 can be formed in the substrate.

Also, although the aforementioned first through third preferred embodiments use the silicon nitride film as an example, the stopper film 3 is not limited to the silicon nitride film 3. In the manufacturing methods of the first and the second preferred embodiments, the stopper film 3 only has to be resistant to dry etching of dielectric (for example, silicon oxide film 11), while in the method of the third preferred embodiment, it only has to be resistant to both dry etching and wet etching of dielectric. The aforementioned effects can be obtained when a dielectric on such a stopper film is dry etched by the etch selectivity as described above.

While the invention has been described in detail, the foregoing description is in all aspects illustrative and not restrictive. It is understood that numerous other modifications and variations can be devised without departing from the scope of the invention.

We claim:

1. A method of manufacturing a semiconductor device, comprising the steps of:
   (a) forming a stopper film over the surface of a semiconductor substrate;
   (b) etching said stopper film and part of said semiconductor substrate in a predetermined region from the surface of said stopper film toward the inside of said semiconductor substrate to form a trench that forms an element isolation region and an active region that is separate from said element isolation region;
   (c) forming a dielectric on said surface of said stopper film and inside said trench by a film formation method that performs etching and deposition at the same time, to fill said trench with said dielectric to a level of said surface of said stopper film;
   (d) forming a resist on said dielectric in said element isolation region, and on said dielectric in a part of said active region, said resist extending from the edge of said element isolation region to a predetermined distance not less than an alignment margin;
   (e) etching and removing said dielectric in said active region that is not covered with said resist, with said resist used as a mask, by predetermined etch selectivity of said dielectric to said stopper film;
   (f) removing said resist to expose said dielectric covered with said resist;
   (g) removing said exposed dielectric in said active region; and
   (h) removing said stopper film;
   said etch selectivity being set so that a residual portion of said stopper film after said step (e) has a film thickness sufficient to fulfill its function at said step (g).

2. The method of claim 1, wherein
said step (d) comprises a step of further forming a resist on the surface of said dielectric in said active region, when the width of said active region is not more than a total value of a value equivalent to twice said predetermined distance the minimum design size of said semiconductor device.

3. The method of claim 1, wherein:
said stopper film is resistant to dry etching of said dielectric; and,
said step (e) comprises a step of dry etching said dielectric in said active region that is not covered with said resist, to be removed.

4. The method of claim 3, wherein
said predetermined etch selectivity is not less than a value obtained by dividing twice a value which is obtained by subtracting a value equivalent to said alignment margin from a value equivalent to a distance from the bottom of said trench to said surface of said stopper film, by a value equivalent to a film thickness of said stopper film; and
said step (g) comprises a step of removing said exposed dielectric by polishing.

5. The method of claim 3, wherein
said predetermined etch selectivity is not less than a value obtained by dividing twice a value which is obtained by subtracting a value equivalent to said predetermined distance from a value equivalent to a distance from the bottom of said trench to said surface of said stopper film, by a value equivalent to a film thickness of said stopper film;
said step (g) comprises a step of removing said exposed dielectric by polishing; and
said predetermined etch selectivity is equivalent to one half of a minimum size of said active region, when said minimum size is not less than said alignment margin.

6. The method of claim 3, wherein
said stopper film is resistant to both dry etching and wet etching of said dielectric; and
said step (e) comprises a step of partially etching said dielectric in said active region that is not covered with said resist by dry etching, and removing said residual dielectric in said active region by wet etching.

7. The method of claim 6, wherein
said predetermined distance is equivalent to a predetermined amount of said wet etching;
said predetermined etch selectivity is not less than a value obtained by dividing twice a value which is obtained by subtracting a value equivalent to twice said predetermined distance from a value equivalent to the distance from the bottom of said trench to said surface of said stopper film, by a value equivalent to the film thickness of said stopper film; and
said step (g) comprises a step of removing said dielectric by polishing.

8. The method of claim 1, wherein said predetermined etch selectivity is not less than 2(c−a)/d,
wherein c is a distance from the bottom of said trench to said surface of said stopper film, a is said alignment margin, and d is a film thickness of said stopper film.

9. The method of claim 8, wherein a minimum size of said active region is not less than said alignment margin.

10. The method of claim 8, wherein c is about 205 nm to 830 mn, and d is about 100 n to 300 nm.

11. The method of claim 1, wherein said predetermined etch selectivity is not less than 2(c−e)/d,
wherein c is a distance from the bottom of said trench to said surface of said stopper film, e is one half of a minimum size of said active region, and d is a film thickness of said stopper film.

12. The method of claim 11, wherein a minimum size of said active region is not less than said alignment margin.

13. The method of claim 11, wherein c is about 205 nm to 830 nm, and d is about 100 nm to 300 nm.

* * * * *

UNITED STATES PATENT AND TRADEMARK OFFICE
CERTIFICATE OF CORRECTION

PATENT NO. : 6,268,263 B1
DATED : July 31, 2001
INVENTOR(S) : Sakai et al.

Page 1 of 1

It is certified that error appears in the above-identified patent and that said Letters Patent is hereby corrected as shown below:

Title page,
Item [54], in the title, "METHOD OF" should read -- METHOD FOR --.

Column 2,
Line 2, change "described" to -- describe --;
Line 40, change "11A" to -- 111A --.

Column 9,
Line 41, change "2I1" to -- 2I --.

Column 10,
Line 50 (second occurrence), change "11D" to -- 11F --.

Column 14,
Line 25, change "shorten" to -- shortened --.

Column 15,
Line 3, change "pattern" to -- patterned --.
Line 41, "11IF" to -- 11F --.

Column 17,
Line 62, after "distance", insert -- plus --.

Signed and Sealed this

Thirtieth Day of April, 2002

*Attest:*

*Attesting Officer*

JAMES E. ROGAN
*Director of the United States Patent and Trademark Office*